US011152242B2

(12) United States Patent
Kuwahara et al.

(10) Patent No.: US 11,152,242 B2
(45) Date of Patent: Oct. 19, 2021

(54) SUBSTRATE TREATING APPARATUS AND METHOD FOR CONTROLLING SUBSTRATE TREATING APPARATUS

(71) Applicant: SCREEN Holdings Co., Ltd., Kyoto (JP)

(72) Inventors: Joji Kuwahara, Kyoto (JP); Seiji Murai, Kyoto (JP)

(73) Assignee: SCREEN Holdings Co., Ltd.

( * ) Notice: Subject to any disclaimer, the term of this patent is extended or adjusted under 35 U.S.C. 154(b) by 103 days.

(21) Appl. No.: 16/556,294

(22) Filed: Aug. 30, 2019

(65) Prior Publication Data

US 2020/0098611 A1  Mar. 26, 2020

(30) Foreign Application Priority Data

Sep. 21, 2018 (JP) .............................. JP2018-178016

(51) Int. Cl.
*H01L 21/67* (2006.01)
*H01L 21/677* (2006.01)
(Continued)

(52) U.S. Cl.
CPC ........ *H01L 21/67769* (2013.01); *B65G 47/90* (2013.01); *H01L 21/67161* (2013.01);
(Continued)

(58) Field of Classification Search
None
See application file for complete search history.

(56) References Cited

U.S. PATENT DOCUMENTS

2007/0177870 A1  8/2007 Hamada .................... 396/611
2007/0190437 A1  8/2007 Kaneyama et al.
(Continued)

FOREIGN PATENT DOCUMENTS

JP  2010-171314 A  8/2010
JP  2012-209288 A  10/2012
(Continued)

OTHER PUBLICATIONS

Office Action dated Jul. 13, 2020 for corresponding Taiwan Patent Application No. 108130743.
(Continued)

*Primary Examiner* — Ronald P Jarrett
(74) *Attorney, Agent, or Firm* — Ostrolenk Faber LLP

(57) ABSTRACT

A second substrate transportation mechanism is generally set to transport a substrate from a substrate buffer unit to a FOUP placed on an opener. However, if a predetermined condition is satisfied, the second substrate transportation mechanism transports a substrate from the FOUP to the substrate buffer unit. That is, the second substrate transportation mechanism performs an operation different from an ordinary substrate transportation operation. Accordingly, a FOUP transportation mechanism can leave a specific FOUP at a placement position (opener) of the specific FOUP from when all the substrates are taken from the specific FOUP to when all the treated substrates are accommodated in the specific FOUP. Thus, the FOUP transportation mechanism can transport FOUPs except for the specific FOUP so that FOUP transportation efficiency can be enhanced.

3 Claims, 19 Drawing Sheets

(51) Int. Cl.
    *B65G 47/90* (2006.01)
    *H01L 21/687* (2006.01)
(52) U.S. Cl.
    CPC .. *H01L 21/67184* (2013.01); *H01L 21/67225* (2013.01); *H01L 21/67772* (2013.01); *H01L 21/67775* (2013.01); *H01L 21/67781* (2013.01); *H01L 21/68707* (2013.01)

(56) References Cited

U.S. PATENT DOCUMENTS

| | | | |
|---|---|---|---|
| 2010/0228378 A1* | 9/2010 | Fukutomi | H01L 21/67769 700/112 |
| 2011/0222994 A1 | 9/2011 | Inagaki et al. | 414/222.07 |
| 2012/0249990 A1 | 10/2012 | Nishimura et al. | 355/72 |
| 2013/0272824 A1 | 10/2013 | Iida et al. | 414/222.01 |
| 2014/0286733 A1 | 9/2014 | Ogura et al. | 414/217.1 |
| 2015/0179490 A1 | 6/2015 | Yamamoto | |
| 2018/0147599 A1 | 5/2018 | Tanaka et al. | |

FOREIGN PATENT DOCUMENTS

| | | |
|---|---|---|
| JP | 2013-157650 A | 8/2013 |
| KR | 10-2011-0102177 A | 9/2011 |
| KR | 10-2013-0116021 A | 10/2013 |
| KR | 10-2015-0036040 A | 4/2015 |
| TW | I327747 B | 7/2010 |
| TW | I370510 B | 8/2012 |
| TW | I661473 B | 6/2019 |
| WO | WO 2013/069716 A1 | 5/2013 |

OTHER PUBLICATIONS

Office Action dated Jan. 29, 2021 for corresponding Korean Patent Application No. 10-2019-0106433.
Notice of Allowance dated Aug. 19, 2021 for corresponding Korean Patent Application No. 10-2019-0106433.

\* cited by examiner

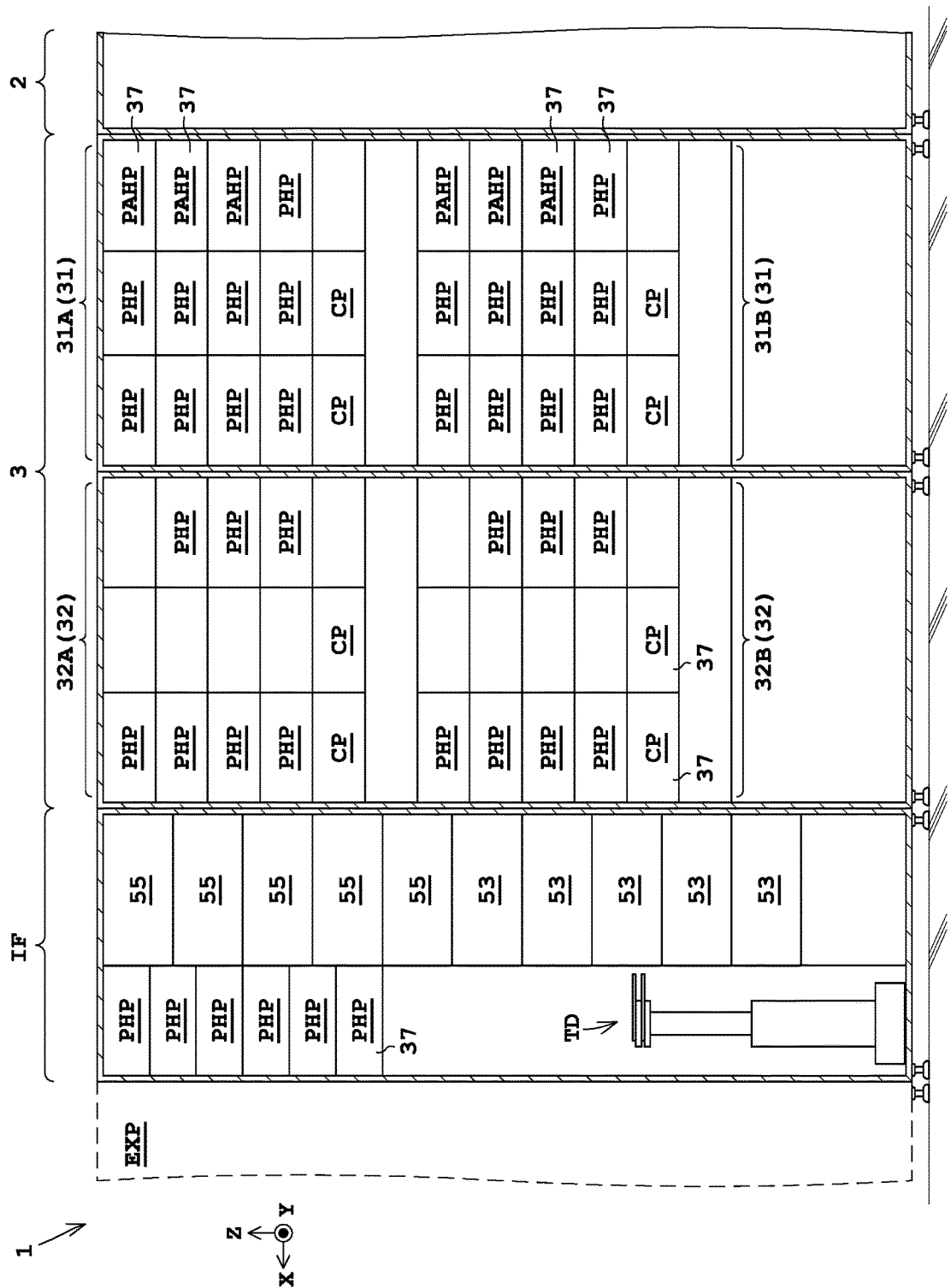

Fig. 12

OPERATION PRIORITY ORDER OF FOUP BUFFER DEVICE

| PRIORITY 1 | RETURN | TRANSPORT TREATED SUBSTRATE FOUP FROM OPENER TO OUTPUT PORT |
| --- | --- | --- |
| | | TRANSPORT TREATED SUBSTRATE FOUP FROM TREATED SUBSTRATE FOUP SHELF TO OUTPUT PORT |
| PRIORITY 2 | RETURN | TRANSPORT TREATED SUBSTRATE FOUP FROM OPENER TO TREATED SUBSTRATE FOUP SHELF |
| PRIORITY 3 | RETURN | TRANSPORT EMPTY FOUP FROM EMPTY FOUP SHELF TO OPENER |
| PRIORITY 4 | | TRANSPORT EMPTY FOUP FROM OPENER TO EMPTY FOUP SHELF |
| PRIORITY 5 | SEND | TRANSPORT UNTREATED SUBSTRATE FOUP FROM INPUT PORT TO OPENER |
| | SEND | TRANSPORT UNTREATED SUBSTRATE FOUP FROM UNTREATED SUBSTRATE FOUP SHELF TO OPENER |
| PRIORITY 6 | SEND | TRANSPORT UNTREATED SUBSTRATE FOUP FROM INPUT PORT TO UNTREATED SUBSTRATE FOUP SHELF |

SUBSTRATE TREATING APPARATUS AND METHOD FOR CONTROLLING SUBSTRATE TREATING APPARATUS

CROSS-REFERENCE TO RELATED APPLICATIONS

This application claims priority to Japanese Patent Application No. 2018-178016 filed Sep. 21, 2018, the subject matter of which is incorporated herein by reference in entirety.

BACKGROUND OF THE INVENTION

Technical Field

The present invention relates to a substrate treating apparatus for treating a substrate and a method of controlling a substrate treating apparatus. Examples of substrates include semiconductor substrates, substrates for flat panel displays (FPDs), glass substrates for photomasks, substrates for optical disks, substrates for magnetic disks, ceramic substrates, and substrates for solar cells. Examples of the FPDs include liquid crystal display devices and organic electroluminescence (EL) display devices.

Description of the Related Art

A currently-used substrate treating apparatus includes an indexer block (indexer apparatus), a treating block, and a FOUP buffer device (stocker device). A treating block is connected to a rear surface of the indexer block. A FOUP buffer device is connected to a front surface of the indexer block (see, for example, Japanese Unexamined Patent Application Publications Nos. 2012-209288, 2013-157650, and 2010-171314).

Two openers are disposed side by side horizontally in an outer wall at the front of the indexer block. A substrate buffer unit on which a plurality of substrates can be placed in an upward/downward direction (vertical direction) is disposed between the indexer block and the treating block (see Japanese Unexamined Patent Application Publication No. 2012-209288).

Two substrate transportation mechanisms are disposed inside the indexer block. A first substrate transportation mechanism is configured to transport substrates between a front opening unified pod (FOUP) placed on a first opener and the substrate buffer unit. A second substrate transportation mechanism is configured to transport substrates between a FOUP placed on a second opener and the substrate buffer unit. That is, the first substrate transportation mechanism transports the substrates for the first opener, and the second substrate transportation mechanism transports the substrates for the second opener. Accordingly, the substrates can be efficiently taken from the FOUPs, and can be efficiently accommodated in the FOUPs.

The FOUP buffer device includes a shelf on which a FOUP is placed to keep the FOUP and a FOUP transportation mechanism for transporting the FOUP between the shelf and two openers. Japanese Unexamined Patent Application Publication No. 2013-157650 discloses a FOUP transportation mechanism including two grippers and an exchanging operation (replacing operation) of FOUPs with the two grippers.

Japanese Unexamined Patent Application Publication No. 2010-171314 discloses a FOUP buffer device including a taking opener for taking substrates, an accommodating opener for accommodating substrates, and an accommodating shelf for accommodating an empty FOUP from which substrates are taken. Japanese Unexamined Patent Application Publication No. 2012-209288 and International Patent Publication No. WO2013/069716 disclose a plurality of openers arranged in an upward/downward direction.

SUMMARY

A currently-used device having such a configuration, however, has the following problems. With a low transportation efficiency of FOUPs, a substrate transportation mechanism of an indexer block might wait for FOUPs. Thus, to enhance throughput of a substrate treatment, a FOUP transportation efficiency is desirably increased.

It is therefore an object of the present invention to provide a substrate treating apparatus capable of increasing FOUP transportation efficiency and a method for controlling the substrate treating apparatus.

Solution to Problem

To achieve the object, the present invention provides a configuration as follows. Specifically, a substrate treating apparatus according to the present invention includes: a treating block that performs a predetermined treatment on a substrate transported from a carrier capable of accommodating a plurality of substrates; two or more first carrier platforms on each of which the carrier is placed; two or more second carrier platforms on each of which the carrier is placed; a substrate buffer unit configured to be used for sending a substrate to the treating block and for returning a substrate from the treating block, a plurality of substrates being allowed to be placed on the substrate buffer unit; a substrate transportation mechanism that transports a substrate; an empty carrier shelf on which the carrier which is empty after having taken every substrate from the carrier, and a carrier transportation mechanism configured to transport the carrier, the substrate transportation mechanism being set to transport a substrate to the substrate buffer unit from the carrier placed on each of the two or more first carrier platforms, and is set to transport a substrate from the substrate buffer unit to the carrier placed on each of the two or more second carrier platforms, in a case where the carrier is not placed on any of the two or more first carrier platforms, a case where the carrier is not placed on at least one of the two or more second carrier platforms, and a case where the carrier is not placed on the empty carrier shelf, the carrier transportation mechanism transporting a specific carrier to one of the two or more second carrier platforms, the substrate transportation mechanism transporting a substrate from the specific carrier to the substrate buffer unit, and then transporting a treated substrate treated in the treating block from the substrate buffer unit to the specific carrier, and the carrier transportation mechanism leaving the specific carrier at a placement position of the specific carrier from when every substrate is taken from the specific carrier by the substrate transportation mechanism to when every treated substrate is accommodated in the specific carrier.

In a substrate treating apparatus according to the present invention, the substrate transportation mechanism is generally set to transport a substrate from the substrate buffer unit to a carrier placed on the second carrier platform. However, if a predetermined condition is satisfied, the substrate transportation mechanism transports a substrate from the carrier to the substrate buffer unit. That is, the substrate transportation mechanism performs an operation different from an ordinary substrate transportation operation. Accordingly, the carrier transportation mechanism can leave a specific carrier at a placement position of the specific carrier from when all the substrates are taken from the specific carrier to when all the treated substrates are accommodated in the specific carrier. Thus, the carrier transportation mechanism can transport carriers except for the specific carrier so that carrier transportation efficiency can be enhanced. As a result, a standby state for carrier transportation can be reduced so that throughput of a substrate treatment can be enhanced.

As an example of the substrate treating apparatus described above, in a case where the carrier is not placed on any of the two or more first carrier platforms, a case where the carrier is not placed on one of the two or more second carrier platforms, and a case where the carrier is not placed on the empty carrier shelf, the carrier transportation mechanism transports a specific carrier to one of the two or more second carrier platforms. For example, in some cases, no carrier is placed on a predetermined second carrier platform, but a carrier is placed on another second carrier platform. Even in such a case, the carrier transportation mechanism can leave the specific carrier at a placement position of the specific carrier from when all the substrates are taken from the specific carrier to when all the treated substrates are accommodated in the specific carrier.

The substrate treating apparatus described above further includes an upstream storage shelf disposed upstream of the first carrier platform. The substrate transportation mechanism takes every substrate from the carrier placed on one of the two or more first carrier platforms to generate a first empty carrier, the carrier transportation mechanism includes two grippers each configured to grasp the carrier, the carrier transportation mechanism performs a replacing operation of replacing the first empty carrier placed on one of the two or more first carrier platforms by a carrier placed on the upstream storage shelf, by using the two grippers, the carrier transportation mechanism starts an operation of transporting the carrier placed on the upstream storage shelf for the replacing operation before a time expected to be a time when the first empty carrier is generated by a predetermined time length, and the predetermined time length is a duration of time from start of the operation of transporting the carrier placed on the upstream storage shelf to when the carrier transportation mechanism comes to enable transportation of the first empty carrier. Such is preferable.

To enhance carrier transportation efficiency, the carrier transportation mechanism performs a replacing operation. In this case, the carrier transportation mechanism starts transporting a carrier placed on the upstream storage shelf for a replacing operation before a time expected to be the time when the first empty carrier is generated by a predetermined time length. Accordingly, at the time when the first empty carrier is generated, a state where the carrier transportation mechanism can transport the first empty carrier can be obtained. Thus, the empty carrier can be transported in synchronization with the time when the empty carrier is generated so that carrier transportation efficiency can be further enhanced.

In the substrate treating apparatus described above, the substrate transportation mechanism accommodates every substrate on a second empty carrier placed on one of the two or more second carrier platforms to generate a treated substrate carrier, the carrier transportation mechanism includes two grippers each configured to grasp the carrier, the carrier transportation mechanism performs a replacing operation of replacing the treated substrate carrier placed on one of the two or more second carrier platforms by a third empty carrier placed on the empty carrier shelf, by using the two grippers, the carrier transportation mechanism starts an operation of transporting the third empty carrier placed on the empty carrier shelf for the replacing operation before a time expected to be a time when the treated substrate carrier is generated by a predetermined time length, and the predetermined time length is a duration of time from start of the operation of transporting the third empty carrier placed on the empty carrier shelf to when the carrier transportation mechanism comes to enable transportation of the treated substrate carrier. Such is preferable.

To enhance carrier transportation efficiency, the carrier transportation mechanism performs a replacing operation. In this case, the carrier transportation mechanism starts transporting a third empty carrier placed on the empty carrier shelf for a replacing operation at the time before the time expected to be the time when the treated substrate carrier is generated by the predetermined time length. At the time when the treated substrate carrier is generated, a state where the carrier transportation mechanism can transport the treated substrate carrier can be obtained. Thus, the treated substrate carrier can be transported in synchronization with the time when the treated substrate carrier is generated so that carrier transportation efficiency can be further enhanced.

The substrate treating apparatus described above further includes an upstream storage shelf disposed upstream of the two or more first carrier platforms. The substrate transportation mechanism takes every substrate from the carrier placed on one of the two or more first carrier platforms to generate a first empty carrier, and accommodates every substrate in a second empty carrier placed on one of the two or more second carrier platforms to generate a treated substrate carrier, the carrier transportation mechanism includes two grippers each configured to grasp the carrier, the carrier transportation mechanism performs a first replacing operation of replacing the first empty carrier placed on one of the two or more first carrier platforms by the carrier placed on the upstream storage shelf, by using the two grippers, the carrier transportation mechanism performs, after the first replacing operation, a second replacing operation of replacing a third empty carrier placed on the empty carrier shelf by the first empty carrier grasped by one of the two grippers, by using the two grippers, the carrier transportation mechanism performs, after the second replacing operation, a third replacing operation of replacing the treated substrate carrier placed on one of the two or more second carrier platforms by the third empty carrier grasped by one of the two grippers, by using the two grippers, the carrier transportation mechanism starts an operation of transporting the carrier placed on the upstream storage shelf for the first replacing operation before a time expected to be a time when the first empty carrier is generated by a predetermined first time length in a case where a time expected to be a time when the first empty carrier is generated is later than a time expected to be a time when the treated substrate carrier is generated, the carrier transportation mechanism starts an operation of transporting the carrier placed on the upstream storage shelf for the first replacing operation before the time expected to be the time when the treated substrate carrier is generated by a predetermined second time length in a case where the time expected to be the time when the treated substrate carrier is generated is later than the time expected to be the time when the first empty carrier is generated, the predetermined first time length is a duration of time from start of the operation of transporting the carrier placed on the upstream storage shelf to when the carrier transportation mechanism comes to enable transportation of the first empty carrier, and the predetermined second time length is a duration of time from start of the operation of transporting the carrier placed on the upstream storage shelf to when the carrier transportation mechanism comes to enable transportation of the treated substrate carrier. Such is preferable.

To enhance carrier transportation efficiency, the carrier transportation mechanism performs first through third replacing operations. In this case, the carrier transportation mechanism starts transporting the carrier placed on the upstream storage shelf for a replacing operation before a later one of the time expected to be the time when the first empty carrier is generated and the time expected to be the time when a treated substrate carrier is generated, by a predetermined time length. For example, even if carrier transportation is started based on the time expected to be the time when the first empty carrier is generated, when the state where the carrier transportation mechanism can transport the treated substrate carrier is obtained, the substrate transportation mechanism is occasionally being accommodating substrates in the second empty carrier. In such a case, a standby time is generated in the carrier transportation mechanism. According to the present invention, a state where the first empty carrier or the treated substrate carrier can be transported is obtainable in synchronization with the time when the first empty carrier is generated or the time when the treated substrate carrier is generated. Thus, it is possible to further enhance carrier transportation efficiency while reducing a standby time for carrier transportation in the case of replacing carriers consecutively.

One aspect of the present invention provides a method for controlling a substrate treating apparatus according to the present invention, and the substrate treating apparatus including a treating block that performs a treatment on a substrate transported from a carrier capable of accommodating a plurality of substrates, two or more first carrier platforms on each of which the carrier is placed, two or more second carrier platforms on each of which the carrier is placed, a substrate buffer unit configured to be used for sending a substrate to the treating block and for returning a substrate from the treating block, a plurality of substrates being allowed to be placed on the substrate buffer unit, a substrate transportation mechanism that transports a substrate, an empty carrier shelf on which the carrier which is empty after having taken every substrate from the carrier, and a carrier transportation mechanism that transports the carrier. The method for controlling the substrate treating device includes the steps of: setting the substrate transportation mechanism to transport a substrate to the substrate buffer unit from the carrier placed on each of the two or more first carrier platforms; setting the substrate transportation mechanism to transport a substrate from the substrate buffer unit to the carrier placed on each of the two or more second carrier platforms; causing the carrier transportation mechanism to transport a specific carrier to one of the two or more second carrier platforms in a case where the carrier is not placed on any of the two or more first carrier platforms, a case where the carrier is placed on at least one of the two or more second carrier platforms, and a case where the carrier is not placed on the empty carrier shelf; causing the substrate transportation mechanism to transport a substrate from the specific carrier to the substrate buffer unit and then to transport a treated substrate treated by the treating block from the substrate buffer unit to the specific carrier; and causing the carrier transportation mechanism to leave the specific carrier at a placement position of the specific carrier from when every substrate is taken from the specific carrier by the substrate transportation mechanism to when every treated substrate is accommodated in the specific carrier.

In the method for controlling a substrate treating apparatus according to the present invention, the substrate transportation mechanism is generally set to transport a substrate from the substrate buffer unit to a carrier placed on the second carrier platform. However, if a predetermined condition is satisfied, the substrate transportation mechanism transports a substrate from the carrier to the substrate buffer unit. That is, the substrate transportation mechanism performs an operation different from an ordinary substrate transportation operation. Accordingly, the carrier transportation mechanism can leave a specific substrate at a placement position of the specific carrier from when all the substrates are taken from the specific carrier to when all the treated substrates are accommodated in the specific carrier. Thus, the carrier transportation mechanism can transport carriers except for the specific carrier so that carrier transportation efficiency can be enhanced. As a result, a standby time for carrier transportation can be reduced so that throughput of a substrate treatment can be enhanced.

Advantageous Effects of Invention

In the substrate treating apparatus and the method for controlling the substrate treating apparatus according to the present invention, carriers can be efficiently transported.

BRIEF DESCRIPTION OF THE DRAWINGS

For the purpose of illustrating the invention, there are shown in the drawings several forms which are presently preferred, it being understood, however, that the invention is not limited to the precise arrangement and instrumentalities shown.

FIG. 6 is a left side view of the treating block illustrating arrangement of heat-treatment units.

FIG. 12 is a table showing an operation priority order of the FOUP buffer device.

EMBODIMENTS

First Embodiment

Figure 1:
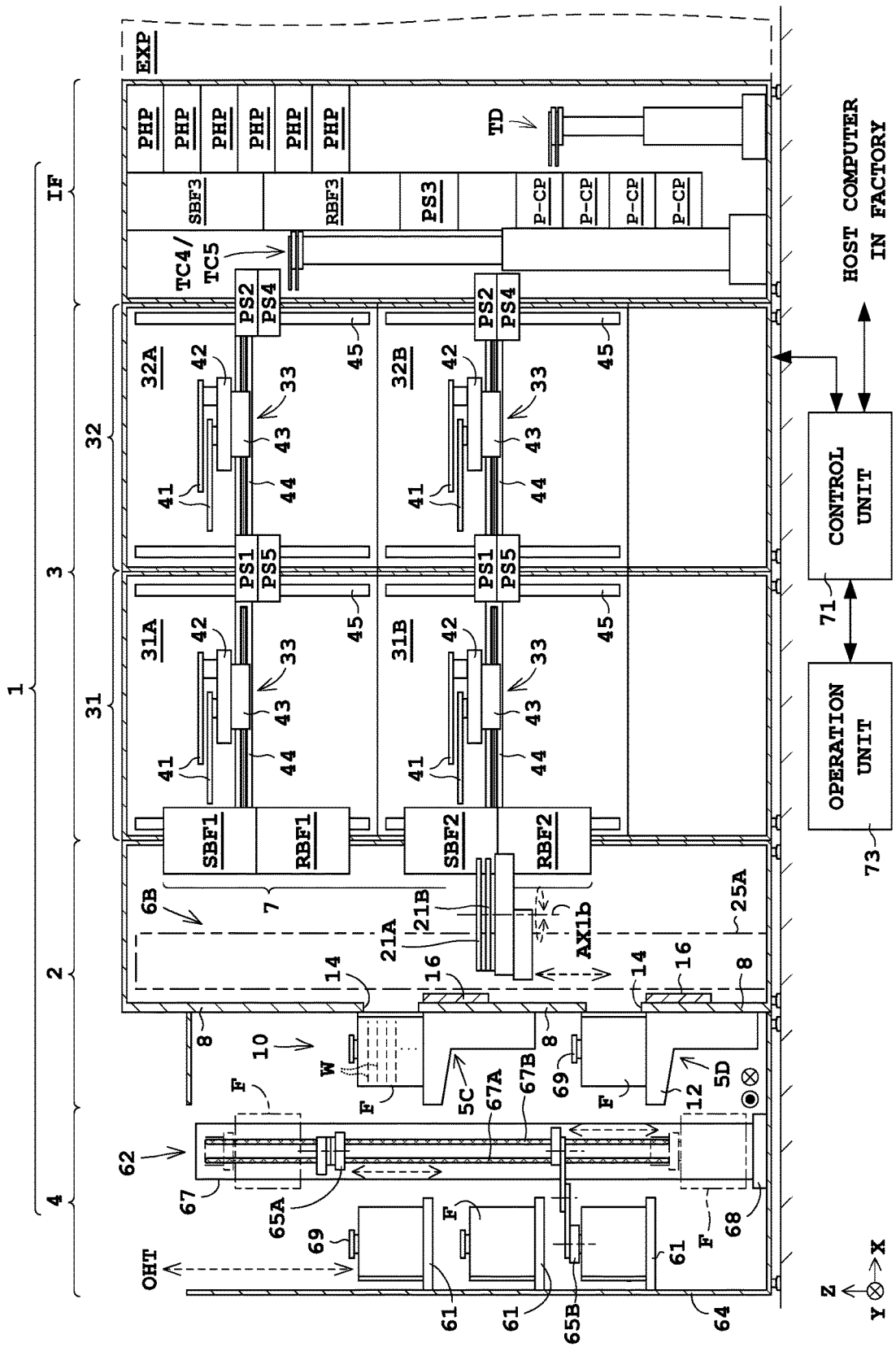
FIG. 1 is a longitudinal cross-sectional view of a substrate treating apparatus according to a first embodiment.
Figure 2:
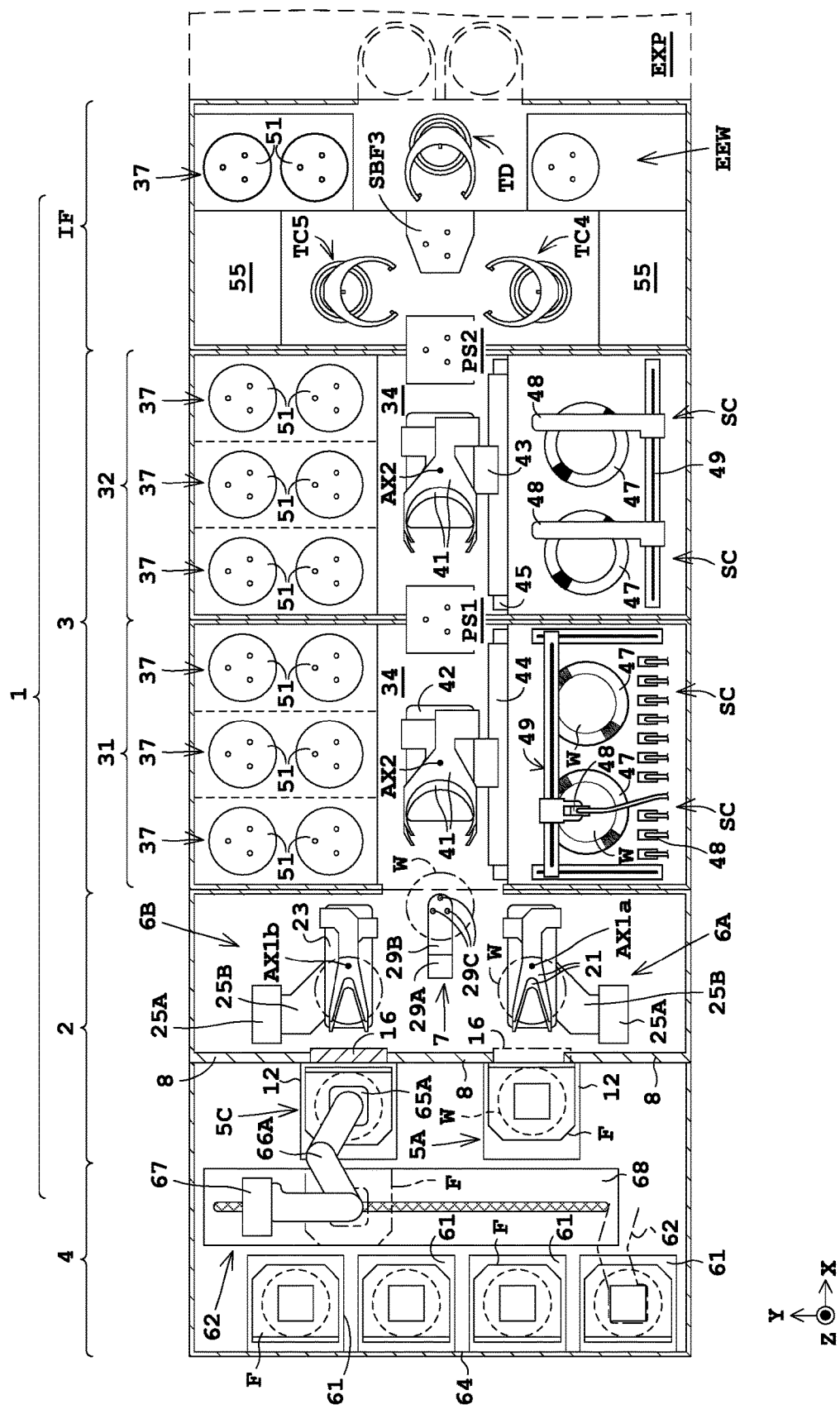
FIG. 2 is a transverse cross-sectional view of the substrate treating apparatus according to the first embodiment.
Figure 3A:
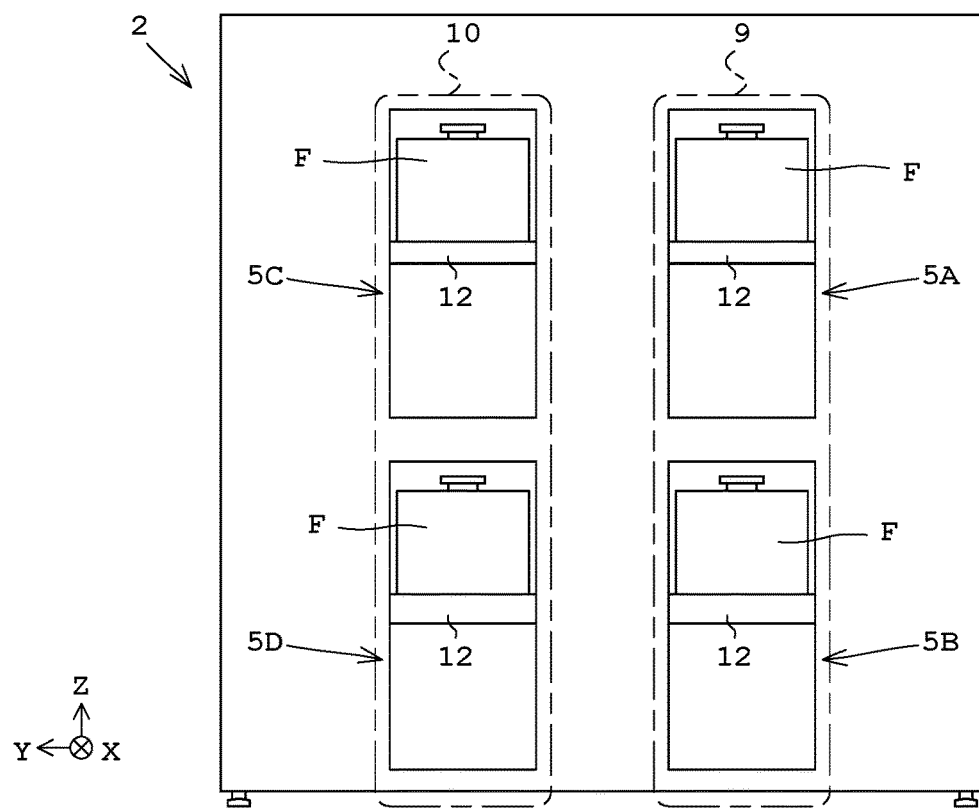
FIG. 3A is a front view illustrating four openers of an indexer block.
Figure 3B:
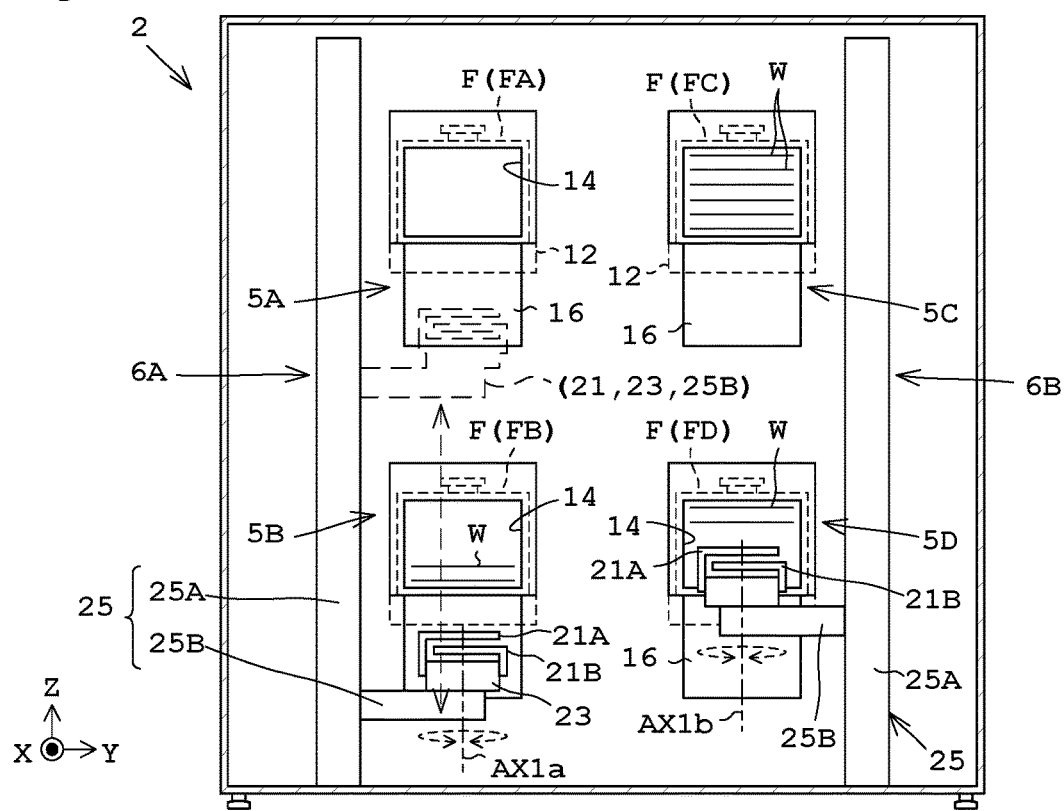
FIG. 3B is a rear view of the four openers seen from two substrate transportation mechanisms.

A first embodiment of the present invention will be described hereinafter with reference to the drawings. FIG. 1 is a longitudinal cross-sectional view of a substrate treating apparatus according to the first embodiment. FIG. 2 is a transverse cross-sectional view of the substrate treating apparatus according to the first embodiment. FIG. 3A is a front view illustrating four openers of an indexer block. FIG. 3B is a rear view of the four openers seen from two substrate transportation mechanisms.

Description will be made with reference to FIG. 1 or FIG. 2. The substrate treating apparatus 1 forms resist films, for example, on substrates W and develops substrates W exposed to light. The substrate treating apparatus 1 includes the indexer block 2 (hereinafter referred to as an "ID block 2" as necessary), a treating block 3, a FOUP buffer device 4 (stocker device), and an interface block IF. The interface block IF is coupled to a rear surface of the treating block 3. The treating block 3 is coupled to a rear surface of the ID block 2. The FOUP buffer device 4 is coupled to a front surface of the ID block 2.

[ID (Indexer) Block 2]

The ID block 2 transports substrates W to a carrier. The ID block 2 includes the four openers 5A to 5D (see FIG. 3A), two substrate transportation mechanisms 6A and 6B, and a substrate buffer unit 7. The four openers 5A to 5D are provided on a wall portion 8 of the front surface of the ID block 2.

As illustrated in FIG. 3A, the four openers 5A to 5D are classified into two groups of a first opener line 9 and a second opener line 10. The first opener line 9 includes the two openers 5A and 5B disposed in the upward/downward direction. The second opener line 10 includes the two openers 5C and 5D disposed in the upward/downward direction. The second opener line 10 is disposed at a side of the first opener line 9 in the horizontal direction (Y-direction). In FIG. 3A, the first opener 5A is disposed above the second opener 5B. The third opener 5C is disposed above the fourth opener 5D.

A carrier is placed on each of the four openers 5A to 5D. The carrier is, for example, a FOUP F. The carrier is not limited to a FOUP F as long as the carrier has an openable lid portion. The carrier will now be described using the FOUP F as an example. The FOUP F is capable of accommodating a plurality of (e.g., 25) substrates W in a horizontal orientation. The FOUP F includes an opening through which the substrates W are inserted or taken out. The FOUP F also includes a FOUP body configured to accommodate the substrates W and a lid portion for covering the opening.

Each of the four openers 5A to 5D opens and closes the lid portion of the FOUP F placed on the opener. Each of the four openers 5A to 5D includes a mount table 12, an opening 14, a shutter 16, and a shutter driving unit (not shown). The FOUP F is placed on the mount table 12. The opening 14 is an opening for transferring the substrates W between the inside of the FOUP F and the inside of the ID block 2. The shutter 16 is used for covering the opening 14. The shutter 16 locks the lid portion at the FOUP body and cancels the locking. The shutter 16 is configured to hold the lid portion. The shutter 16 holds the lid portion by adsorbing the lid portion with a vacuum, for example. The shutter 16 is moved in the upward/downward direction and in the front-rear direction by the shutter driving unit including an electric motor.

As illustrated in FIG. 2, the first substrate transportation mechanism 6A faces the first opener line 9 (including the opener 5A). The second substrate transportation mechanism 6B faces the second opener line 10 (including the opener 5C). The first substrate transportation mechanism 6A transports substrates W between the FOUP F placed on each of the two openers 5A and 5B in the first opener line 9, and the substrate buffer unit 7. The second substrate transportation mechanism 6B transports substrates W between the FOUP F placed on each of the two openers 5C and 5D in the second opener line 10, and the substrate buffer unit 7.

Figure 4:
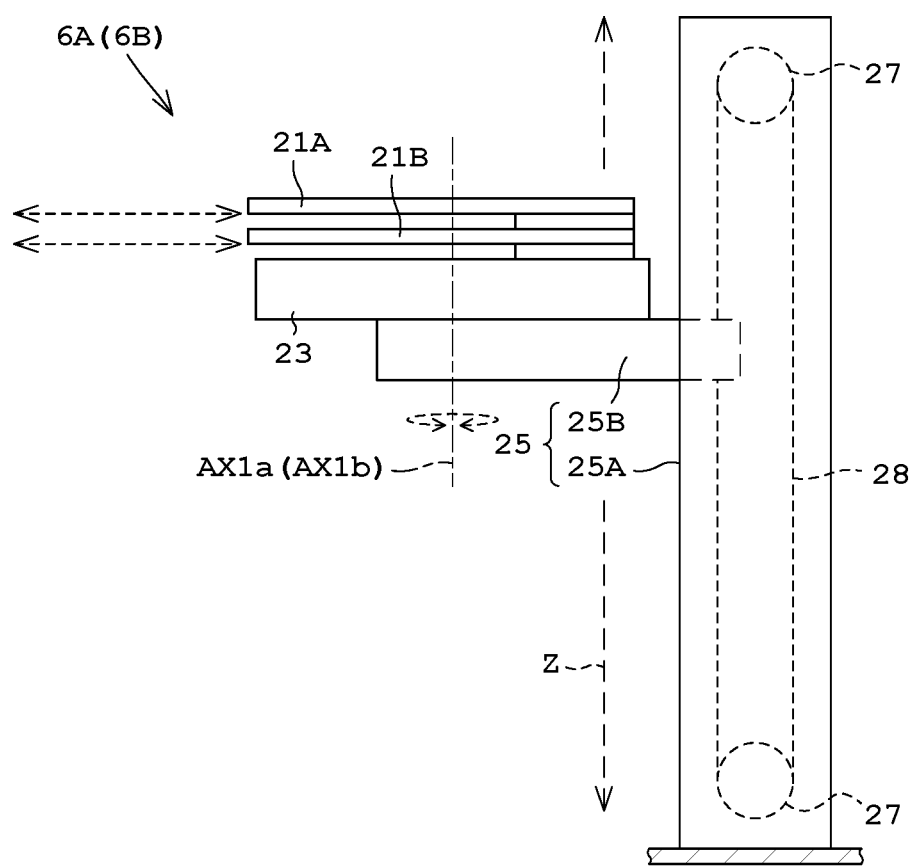
FIG. 4 illustrates a substrate transportation mechanism of the indexer block.

As illustrated in FIGS. 3B and 4, each of the two substrate transportation mechanisms 6A and 6B includes two hands 21 (21A and 21B), a forward/rearward driving unit 23, and a lifting/lowering rotation driving unit 25. Each of the two hands 21A and 21B holds a substrate W. The two hands 21A and 21B are capable of moving forward and backward individually in the horizontal direction, and one or two substrates W can be taken from the FOUP F, for example. Each of the two hands 21A and 21B has a shape whose front end is divided into two, such as a Y shape or a U shape. Each of the two substrate transportation mechanisms 6A and 6B includes the two hands 21A and 21B, but may include three or more hands.

The forward/rearward driving unit 23 movably supports the two hands 21A and 21B, and moves the two hands 21A and 21B forward and backward. To drive the first hand 21A, the forward/rearward driving unit 23 includes, for example, an electric motor, a linear screw shaft, a movable member having a hole that meshes with the screw shaft, and a guide portion that guides the movable member. The first hand 21A is supported by the movable member. Similarly, to drive the second hand 21B, the forward/rearward driving unit 23 includes, for example, an electric motor, a screw shaft, a movable member, and a guide portion.

The lifting/lowering rotation driving unit 25 lifts, lowers, and rotates the forward/rearward driving unit 23 to thereby lift, lower, and rotate the two hands 21A and 21B. The lifting/lowering rotation driving unit 25 includes a strut portion 25A and a rotation portion 25B. The strut portion 25A extends in the upward/downward direction. The strut portion 25A is fixed to the floor of the ID block 2. Accordingly, the strut portion 25A, that is, the position of the lifting/lowering rotation driving unit 25 in the horizontal direction (especially in the Y-direction), does not move and is fixed.

The rotation portion 25B is lifted and lowered along the strut portion 25A. The strut portion 25A includes, for example, an electric motor (not shown), two pulleys 27, and a belt 28. The belt 28 is wound around the two pulleys 27. The rotation portion 25B is attached to the belt 28. Rotation of the electric motor is transferred to one of the two pulleys 27 and causes the belt 28 to move. The rotation portion 25B moves together with movement of the belt 28.

The rotation portion 25B rotates the forward/rearward driving unit 23 about a vertical axis AX1a or a vertical axis AX1b extending along the strut portion 25A. Accordingly, orientations of the two hands 21A and 21B change. The rotation portion 25B includes, for example, an electric motor, two pulleys, and a belt.

As described above, the position of the strut portion 25A, that is, the position of the lifting/lowering rotation driving unit 25 in the horizontal direction, does not move and is fixed. Accordingly, the positions of the vertical axes AX1a and AX1b, each of which is a rotation center of the forward/rearward driving unit 23, in the horizontal direction are also fixed. In this manner, the position of the lifting/lowering rotation driving unit 25 in the horizontal direction is fixed. Accordingly, the first substrate transportation mechanism 6A can transport substrates W between the FOUP F of each of the two openers 5A and 5B and the substrate buffer unit 7, but cannot transport substrates between the FOUP F of each of the two openers 5C and 5D and the substrate buffer unit 7. Similarly, the second substrate transportation mechanism 6B can transport substrates W between the FOUPs F of the two openers 5C and 5D and the substrate buffer unit 7, but cannot transport substrates W between the FOUPs F of the two openers 5A and 5B and the substrate buffer unit 7.

Description will now be given with reference to FIGS. 1 and 2 again. A plurality of (e.g., 32) substrates W can be placed on the substrate buffer unit 7. In the substrate buffer unit 7, each of the substrates W is supported in a horizontal orientation, and the plurality of substrates W are arranged in the upward/downward direction. As illustrated in FIG. 2, the substrate buffer unit 7 includes a strut 29A, a plurality of support plates 29B, and three support pins 29C. The strut 29A extends in the vertical direction (Z-direction). Each of the plurality of support plates 29B is supported by the strut 29A to extend in a +X-direction from the ID block 2 to the treating block 3. The three support pins 29C are individually disposed on the upper surfaces of the support plates 29B. The substrates W are supported on top of the support pins 29C. As illustrated in FIG. 2, the substrate buffer unit 7 is disposed between the ID block 2 and the treating block 3 or near a portion between the ID block 2 and the treating block 3.

Each of the two openers 5A and 5B corresponds to a first carrier platform of the present invention. Each of the two openers 5C and 5D corresponds to a second carrier platform of the present invention. Each of the first substrate transportation mechanism 6A and the second substrate transportation mechanism 6B corresponds to a substrate transportation mechanism of the present invention.

[Processing Block 3]

As illustrated in FIG. 1, the treating block 3 includes a coating block 31 and a development block 32. The coating block 31 and the development block 32 are arranged in the horizontal direction (X-direction).

The coating block 31 includes two coating-treatment layers 31A and 31B disposed in the upward/downward direction. The development block 32 includes two development-treatment layers 32A and 32B disposed in the upward/downward direction. Each of the two coating-treatment layers 31A and 31B and the two development-treatment layers 32A and 32B includes a third substrate transportation mechanism 33, a transportation space 34, a liquid treatment unit SC, and a heat-treatment unit 37.

The substrate buffer unit 7 described above includes two sending buffer units SBF1 and SBF2 and two return buffer units RBF1 and RBF2. Each of the sending buffer units SBF1 and SBF2 and the return buffer units RBF1 and RBF2 includes 13 support plates 29B, and 13 substrates W can be placed thereon. For example, the sending buffer unit SBF1 and the return buffer unit RBF1 are used for the first coating-treatment layer 31A, and the sending buffer unit SBF2 and the return buffer unit RBF2 are used for the second coating-treatment layer 31B. Each of the two substrate transportation mechanisms 6A and 6B can transport substrates W to all the sending buffer units SBF1 and SBF2 and the return buffer units RBF1 and RBF2.

The third substrate transportation mechanism 33 are used for transporting substrates W in each of the four treatment layers 31A, 31B, 32A, and 32B. The third substrate transportation mechanism 33 includes two hands 41, a forward/backward driving unit 42, a rotation driving unit 43, a first movement mechanism 44, and a second movement mechanism 45.

Each of the two hands 41 has a shape whose front end is divided into two, such as a Y shape or a U shape. Each of the two hands 41 holds the substrate W. The forward/rearward driving unit 42 moves the two hands 41 forward and backward individually. The rotation driving unit 43 causes the forward/rearward driving unit 42 to rotate about the vertical axis AX2. Accordingly, the orientation of each of the two hands 41 can be changed. The first movement mechanism 44 moves the rotation driving unit 43 in the rightward/leftward direction (X-direction) in FIG. 1. Accordingly, the forward/rearward driving unit 42 can be moved in the X-direction. The second movement mechanism 45 moves the first movement mechanism 44 in the upward/downward direction (Z-direction). Accordingly, the forward/rearward driving unit 42 can be moved in the Z-direction.

Each of the forward/rearward driving unit 42, the rotation driving unit 43, the first movement mechanism 44, and the second movement mechanism 45 includes an electric motor.

As illustrated in FIG. 2, the third substrate transportation mechanism 33 is disposed in the transportation space 34. The transportation space 34 is configured to extend in the horizontal direction (X-direction) linearly. As illustrated in FIG. 2, the transportation space 34 is a rectangular space when seen from above the substrate treating apparatus 1. The liquid-treatment unit SC and the heat-treatment unit 37 sandwich the transportation space 34.

Figure 5:
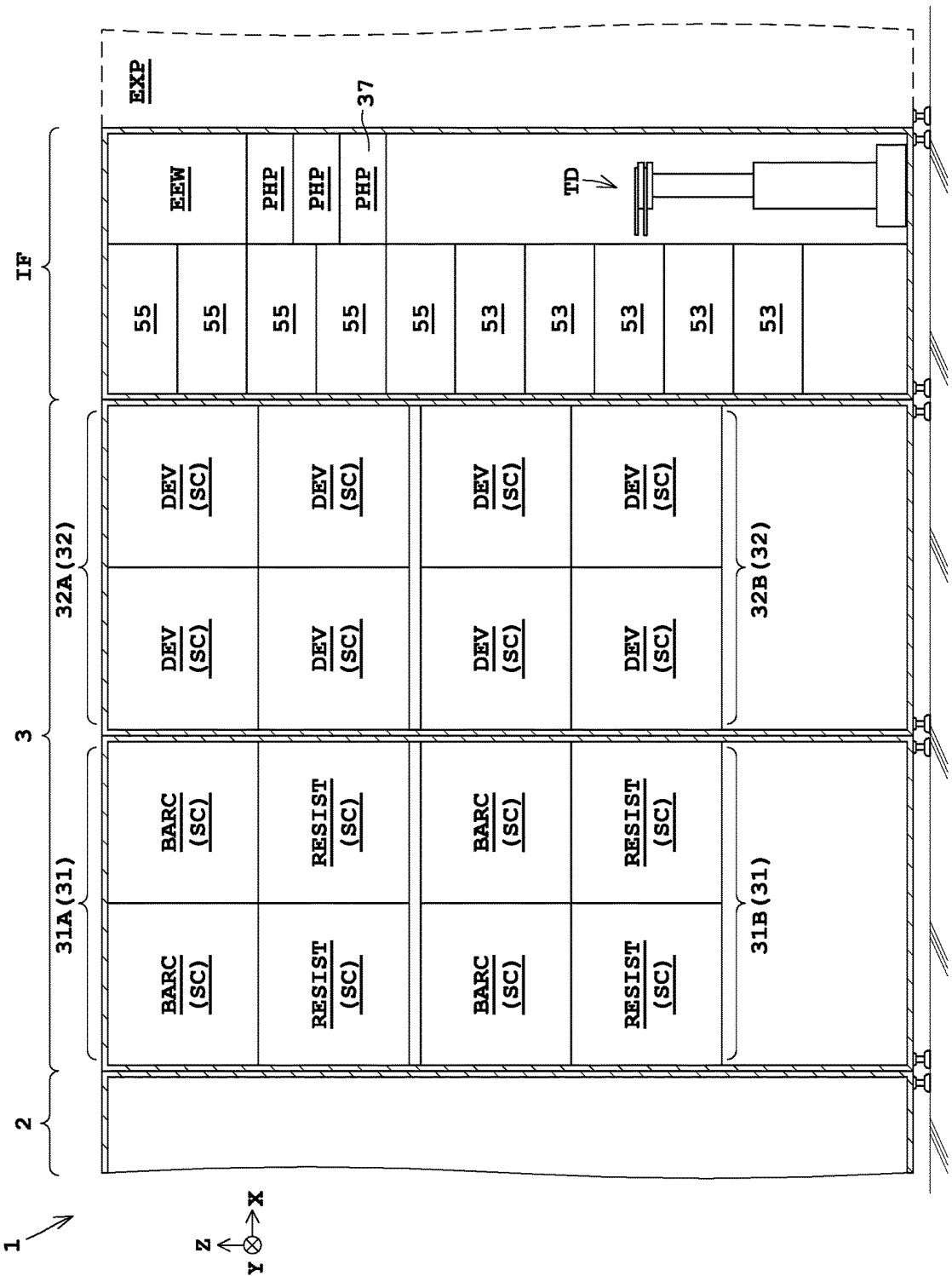
FIG. 5 is a right side view of a treating block illustrating arrangement of liquid-treatment units.

FIG. 5 is a right side view of the treating block 3 illustrating arrangement of the liquid-treatment units SC. Each of the four treatment layers 31A, 31B, 32A, and 32B includes four liquid-treatment units SC. The four liquid-treatment units SC are arranged in two line in the horizontal direction and two levels in the upward/downward direction, that is, are arranged in 2 lines×2 levels. The four liquid-treatment units SC in the coating-treatment layer 31A (31B) are two coating units BARC and two coating units RESIST. The four liquid-treatment units SC in the development-treatment layer 32A (32B) are four development units DEV.

The coating units BARC are used for forming anti-reflection films on substrates W. The coating units RESIST are used for forming resist films such as photoresist films on substrates W. The development units DEV are used for performing development on substrates W that have been exposed to light.

As illustrated in FIG. 2, each of the liquid-treatment units SC includes a holding rotation portion 47, a nozzle 48, and a nozzle moving mechanism 49. The holding rotation portion 47 holds a substrate W by, for example, vacuum adsorption and rotates the substrate W held by the holding rotation portion 47 about the vertical axis (Z-direction). The nozzle 48 is configured to supply a coating solution (e.g., a solution for forming an anti-reflection film or a photoresist solution) or a developer to the substrate W. The nozzle moving mechanism 49 is configured to move the nozzle 48.

FIG. 6 is a left side view of the treating block 3 illustrating arrangement of the heat-treatment units 37. The four treatment layers 31A, 31B, 32A, and 32B include the heat-treatment units 37. The heat-treatment units 37 include plates 51 (see FIG. 2) on which a heat treatment is performed and substrates W are placed. The heat-treatment units 37 are configured to be arranged in 3 lines×5 levels. The coating-treatment layer 31A (31B) includes 14 heat-treatment units 37. That is, the coating-treatment layer 31A (31B) includes three adhesion enhancing treatment units PAHP, two cooling units CP, and nine heating/cooling units PHP. The development-treatment layer 32A (32B) includes two cooling units CP and seven heating/cooling units PHP. The numbers of liquid-treatment units SC, the heat-treatment units 37, and other units (e.g., edge exposure units EEW) are changed as appropriate.

The adhesion enhancing treatment units PAHP are configured to apply an adhesion enhancing agent such as hexamethyldisilazane (HMDS) to substrates W and heats the resulting substrates W to thereby enhance adhesion between the substrates W and the anti-reflection films. The adhesion enhancing treatment units PAHP also have the function of cooling the substrates W after heating. The cooling units CP cool the substrates W. The heating/cooling units PHP sequentially perform heating and cooling in this order.

As illustrated in FIG. 1, for example, transportation of substrates W from the coating-treatment layer 31A to the development-treatment layer 32A is performed through a substrate placing unit PS1. Transportation of substrates W from the development-treatment layer 32A to the interface block IF is performed through a substrate placing unit PS2. Transportation of substrates W from the interface block IF to the development-treatment layer 32A is performed through a substrate placing unit PS4. Transportation of substrates W from the development-treatment layer 32A to the coating-treatment layer 31A is performed through a substrate placing unit PS5. One or more substrates W can be placed on the five substrate placing units PS1 through PS5 including a substrate placing unit PS3 described later.

[Interface Block IF]

The interface block IF is adjacent to an external exposure device EXP as a separate device from the substrate treating apparatus 1. The interface block IF sends substrates W on which resist films are formed to the exposure device EXP, and received substrates W that have been exposed to light form the exposure device EXP.

The interface block IF includes three substrate transportation mechanisms TC4, TC5, and TD, a placing and cooling unit P-CP, the substrate placing unit PS3, a sending buffer unit SBF3, a return buffer unit RBF3, an edge light-exposure unit EEW, a heating/cooling unit PHP, a pre-exposure cleaning unit 53, and a post-exposure cleaning unit 55. The three substrate transportation mechanisms TC4, TC5, and TD are configured similarly to the first substrate transportation mechanism 6A illustrated in FIG. 4, and thus, detailed description thereof will be omitted.

The placing and cooling unit P-CP is a substrate supporting table with a cooling function used for receiving substrates W from the exposure device EXP and sending substrates W to the exposure device EXP. A plurality of substrates W can be placed on each of the sending buffer unit SBF3 and the return buffer unit RBF3. The edge light-exposure unit EEW exposes light to peripheral portions of the substrates W. The heating/cooling unit PHP performs a post-exposure bake (PEB) treatment in this block IF. The pre-exposure cleaning unit 53 cleans and dries substrates W yet to be subjected to an exposure treatment. The post-exposure cleaning unit 55 cleans substrates W subjected to the exposure treatment.

[Operation Example of Treating block 3 and Interface Block IF]

Here, operation examples of the treating block 3 and the interface block IF will be described. In the coating-treatment layer 31A, the third substrate transportation mechanism 33 receives a substrate W from the sending buffer unit SBF1. The third substrate transportation mechanism 33 transports the received substrate W to the adhesion enhancing treatment unit PAHP, the cooling unit CP, and the coating unit BARC illustrated in FIGS. 5 and 6 in this order. Thereafter, the third substrate transportation mechanism 33 transports the substrate W on which an anti-reflection film is formed by the coating unit BARC to the heating/cooling unit PHP, the cooling unit CP, the coating unit RESIST, and the heating/cooling unit PHP in this order. The third substrate transportation mechanism 33 transports the substrate W on which a resist film is formed by the coating unit RESIST to the substrate placing unit PS1.

In the development-treatment layer 32A, the third substrate transportation mechanism 33 transports the substrate W from the substrate placing unit PS1 to the substrate placing unit PS2.

In the interface block IF, the fourth substrate transportation mechanism TC4 receives the substrate W from the substrate placing unit PS2 and transports the received substrates W to the edge light-exposure unit EEW, the pre-exposure cleaning unit 53, and the placing and cooling unit P-CP in this order. The sixth substrate transportation mechanism TD transports the substrate W from the placing and cooling unit P-CP to the exposure device EXP. The sixth substrate transportation mechanism TD transports the substrate W subjected to light exposure by the exposure device EXP, from the exposure device EXP to the substrate placing unit PS3. The fifth substrate transportation mechanism TC5 receives the substrate W from the substrate placing unit PS3, and the received substrate W to the post-exposure cleaning unit 55, the heating/cooling unit PHP, and the substrate placing unit PS4 in this order.

In the development-treatment layer 32A, the third substrate transportation mechanism 33 receives the substrate W from the substrate placing unit PS4, and transports the received substrate W to the cooling unit CP, the development unit DEV, the heating/cooling unit PHP, and the substrate placing unit PS5 in this order.

In the coating-treatment layer 31A, the third substrate transportation mechanism 33 transports the substrate W subjected to development, from the substrate placing unit PS5 to the return buffer unit RBF2.

[FOUP Buffer Device 4]

As illustrated in FIGS. 1 and 2, the FOUP buffer device 4 includes a plurality of (e.g., 12) shelves 61 and a FOUP transportation mechanism 62 for transporting FOUPs F.

The plurality of shelves 61 face the two opener lines 9 and 10 (e.g., two openers 5C and 5D illustrated in FIG. 1). The FOUP transportation mechanism 62 is disposed between the two opener lines 9 and 10 and the plurality of shelves 61. The FOUP transportation mechanism 62 is disposed at the side opposite to the two substrate transportation mechanisms 6A and 6B with the two opener lines 9 and 10 sandwiched between the FOUP transportation mechanism 62 and the two substrate transportation mechanisms 6A and 6B.

Figure 7A:
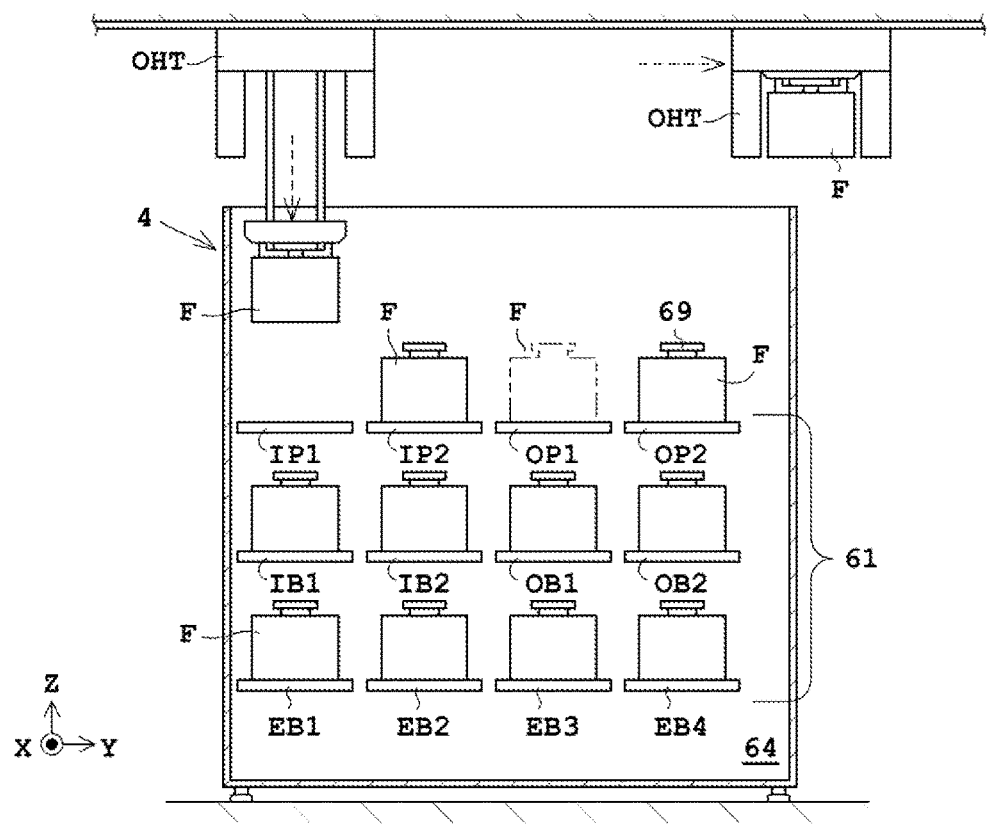
FIG. 7A illustrates shelves of a FOUP buffer device seen from a FOUP transportation mechanism.
Figure 7B:
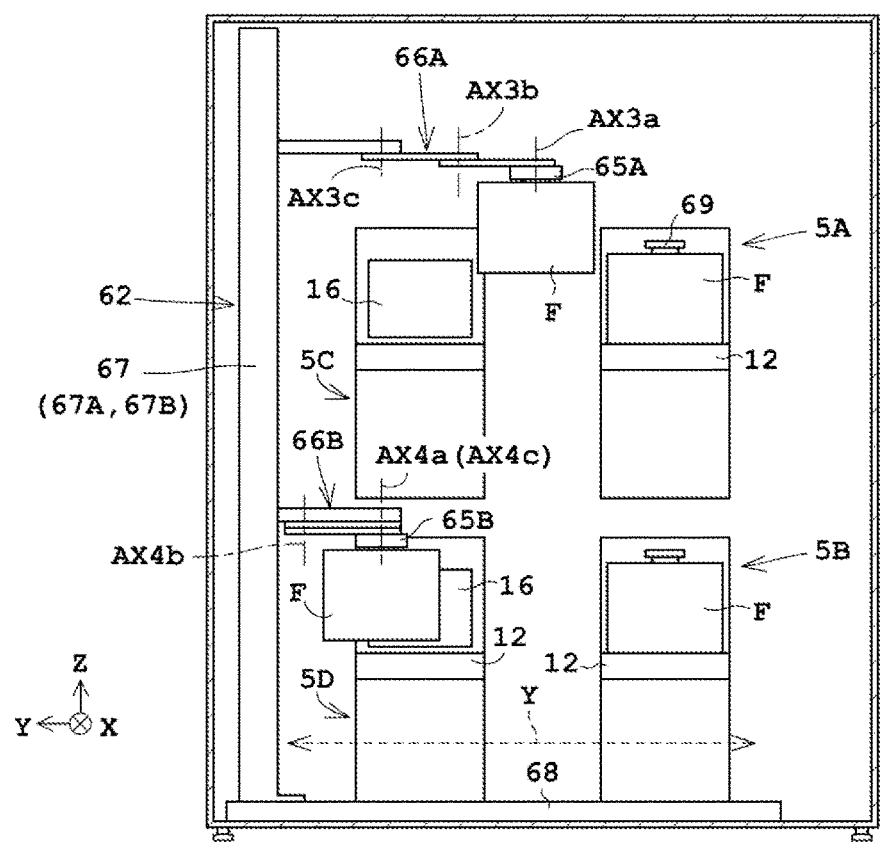
FIG. 7B is a front view illustrating four openers and the FOUP transportation mechanism.

FIG. 7A is a view illustrating the shelves 61 of the FOUP buffer device 4 seen from the FOUP transportation mechanism 62. FIG. 7B is a front view illustrating the four openers 5A to 5D and the FOUP transportation mechanism 62 seen from the shelves 61.

The shelves 61 are configured such that FOUPs F are placed on the shelves 61. The shelves 61 are disposed on a wall portion 64 at the left side (front side) of FOUP buffer device 4 illustrated in FIG. 1. As illustrated in FIG. 7A, the shelves 61 include, for example, two input ports IP1 and IP2 (also referred to as input load ports), two output ports OP1 and OP2 (also referred to as output load ports), two untreated substrate FOUP shelves IB1 and IB2, two treated substrate FOUP shelves OB1 and OB2, four empty FOUP shelves EB1 to EB4. The number and functions of the shelves 61 are set as necessary.

The two input ports IP1 and IP2 are used for receiving FOUPs F from an external transportation mechanism OHT (overhead hoist transport) that transports FOUPs F in a factory. The two output ports OP1 and OP2 are used for sending FOUPs F accommodating treated substrates W to the external transportation mechanism OHT. The two input ports IP1 and IP2 and the two output ports OP1 and OP2 are disposed at the highest level of the shelves 61. To send and receive FOUPs F to/from the external transportation mechanism OHT, a ceiling portion of the FOUP buffer device 4 is open.

In a case where the two openers 5A and 5B are used for taking (sending) substrates W, for example, the two untreated substrate FOUP shelves IB1 and IB2 are used for accommodating FOUPs F that cannot be transported to the two openers 5A and 5B. In a case where the two openers 5C and 5D are used for accommodating (returning) substrates W, for example, the treated substrate FOUP shelves OB1 and OB2 are used for accommodating FOUPs F that cannot be transported from the two openers 5C and 5D to the output ports OP1 and OP2. The four empty FOUP shelves EB1 to EB4 are used for holding empty FOUPs F from which the substrates W have been taken.

As illustrated in FIG. 7B, the FOUP transportation mechanism 62 includes two grippers 65A and 65B, two articulated arms 66A and 66B, an elevation driving unit 67, and horizontal driving unit 68. Each of the two grippers 65A and 65B is configured to grasp a FOUP F. Specifically, each of the two grippers 65A and 65B is configured to grasp a projection 69 provided on top of the FOUP F. The first gripper 65A is attached to a first end portion of the first articulated arm 66A to be rotatable about the vertical axis AX3a. The second gripper 65B is attached to a first end portion of the second articulated arm 66B to be rotatable about the vertical axis AX4a.

Each of the two articulated arms 66A and 66B is of a scalar type, for example. The first articulated arm 66A moves the gripper 65A to a given position in the horizontal direction by rotation of support members coupled to portions around the two vertical axes AX3b and AX3c. The first articulated arm 66A also rotates the first gripper 65A about the vertical axis AX3a to adjust the orientation of the FOUP F. Similarly, the second articulated arm 66B moves the gripper 65B to a given position in the horizontal direction by rotation of support members coupled to portions around two vertical axes AX4b and AX4c. The second articulated arm 66B adjusts the orientation of the FOUP F by rotation of the second gripper 65B about the vertical axis AX4a. Each of the two articulated arms 66A and 66B is attached to the elevation driving unit 67.

As illustrated in FIG. 1, the elevation driving unit 67 includes two driving units 67A and 67B. The first driving unit 67A lifts and lowers the first articulated arm 66A in the upward/downward direction, and the second driving unit 67B lifts and lowers the second articulated arm 66B in the upward/downward direction. That is, the two grippers 65A and 65B are lifted and lowered independently of each other. The two driving units 67A and 67B are arranged in the horizontal direction (e.g., the X-direction).

The first gripper 65A and the first articulated arm 66A are located above the second gripper 65B and the second articulated arm 66B. That is, to prevent collision, the first gripper 65A and the first articulated arm 66A are configured not to move to be below the second gripper 65B and the second articulated arm 66B. In this regard, the elevation driving unit 67 may be configured to move the gripper 65A such that the gripper 65A is located above or below the gripper 65B.

The horizontal driving unit 68 moves the elevation driving unit 67 in the horizontal direction (Y-direction). Accordingly, the two grippers 65A and 65B can approach a FOUP F to which the two articulated arms 66A and 66B cannot reach in a movable range in the horizontal direction. In FIG. 7B, each of the two grippers 65A and 65B can transport FOUPs F to the shelves 61 and all the four openers 5A to 5D.

Each of the two grippers 65A and 65B, the two articulated arms 66A and 66B, the elevation driving unit 67 (two driving units 67A and 67B), and the horizontal driving unit 68 includes an electric motor. Each of the two driving units 67A and 67B may include two pulleys and a belt, for example. The grippers and the articulated arms, for example, may be provided in one pair or three or more pairs, as necessary.

As illustrated in FIG. 1, the substrate treating apparatus 1 includes one or more control units 71 and an operation unit 73. Each of the control units 71 includes, for example, a central processing unit (CPU). The control units 71 control components of the substrate treating apparatus 1. The operation unit 73 includes a display section (e.g., liquid crystal monitor), a memory section, and an input section. The memory section includes, for example, at least one of a read-only memory (ROM), random-access memory (RAM), and a hard disk. The input section includes at least one of a keyboard, a mouse, a touch panel, and various buttons. The memory section stores conditions for substrate treatments and operation programs necessary for controlling the substrate treating apparatus 1.

<Operation of Substrate Treating Apparatus 1>

An operation of the substrate treating apparatus 1 will now be described. First, operations of the two substrate transportation mechanisms 6A and 6B of the substrate treating apparatus 1 will be described.

In FIG. 2, the FOUP transportation mechanism 62 transports a FOUP F to the opener 5A. The shutter 16 of the opener 5A unlocks the lid of the FOUP F placed on the mount table 12 of the opener 5A and holds the lid. Thereafter, the shutter 16 slides downward while uncovering the lid from the FOUP F to thereby allow the opening 14 (see FIG. 3B) to open. Operations of the two openers 5A and 5B (see FIG. 3B) and the first substrate transportation mechanism 6A are previously set for taking (sending) substrates W as normal operations. Thus, the first substrate transportation mechanism 6A starts taking the substrates W from the FOUP F placed on the opener 5A, for example. The substrates W taken from the FOUP F are transported to the substrate buffer unit 7.

[Taking Operation of Substrate W by First Substrate Transportation Mechanism 6A]

Figure 8A:
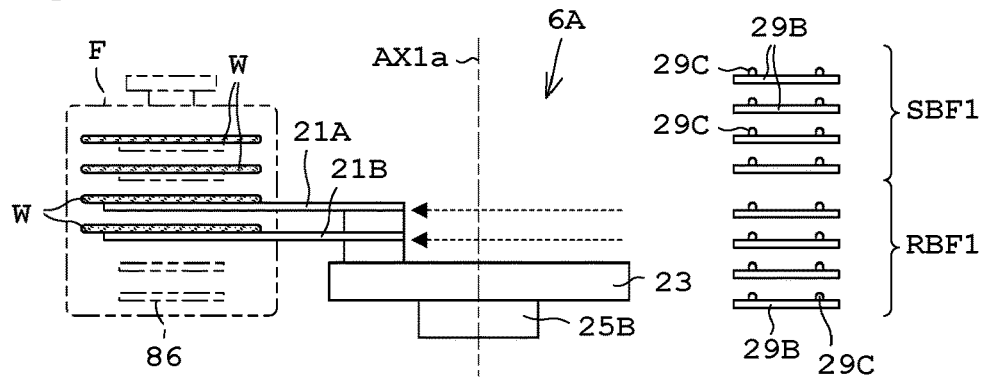
FIGS. 8A to 8D are illustrations for describing an operation of transporting substrates from a FOUP to a buffer unit by a first substrate transportation mechanism.

In FIG. 8A, the forward/rearward driving unit 23 of the first substrate transportation mechanism 6A moves the two hands 21 (21A and 21B) forward to thereby cause the two hands 21 to enter a FOUP F. After the entering, the lifting/lowering rotation driving unit 25 (see FIG. 4) slightly lifts the two hands 21. Accordingly, two substrates W are picked up and held by the two hands 21. After picking up the two substrates W, the forward/rearward driving unit 23 moves the two hands 21 backward while holding the two substrates W.

After the two substrates W have been taken from the FOUP F, these two substrates W are transported to the sending buffer unit SBF1 of the substrate buffer unit 7. A specific operation will be sequentially described. The lifting/lowering rotation driving unit 25 lifts and lowers (lifts in FIG. 8B) the two hands 21 and the forward/rearward driving unit 23 along the vertical axis AX1a, and rotates the two hands 21 and the forward/rearward driving unit 23 about the vertical axis AX1a. Accordingly, the two hands 21 are moved to predetermined heights of the sending buffer unit SBF1 where two substrates W to be held are placed, and at the same time, the two hands 21 are turned to face the sending buffer unit SBF1.

Figure 8B:
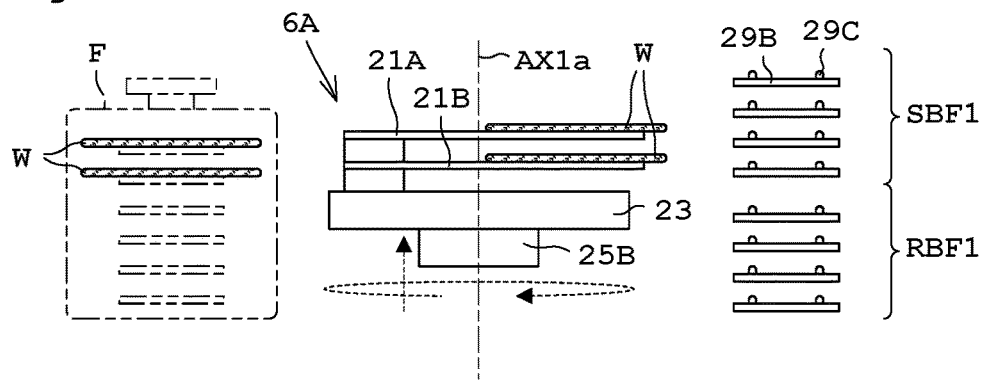
Figure 8C:
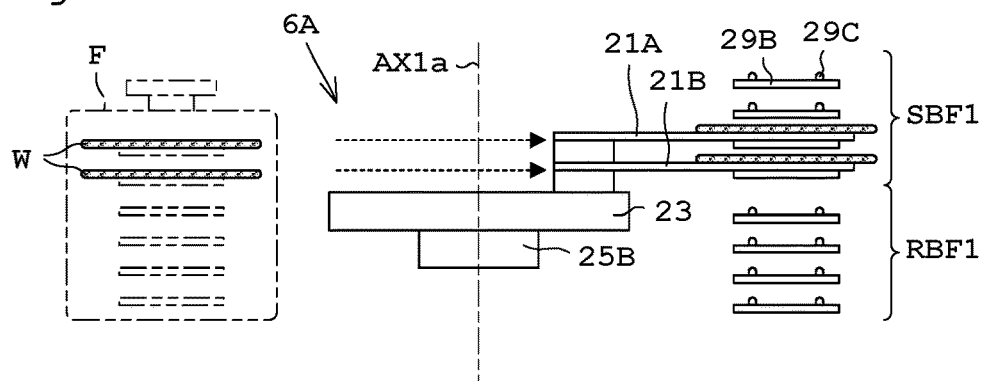

In FIG. 8C, the forward/rearward driving unit 23 moves the two hands 21 holding the two substrates W forward to thereby cause the two hands 21 to enter a region of the sending buffer unit SBF1. After the entering, the lifting/lowering rotation driving unit 25 slightly lowers the two hands 21. Accordingly, the two hands 21 place the two substrates W on the support pins 29C. After the two substrates W have been placed, the forward/rearward driving unit 23 moves the two hands 21 holding no substrate W backward.

After the two substrates W have been transported to the sending buffer unit SBF1, one or two substrates W are taken out again from the FOUP F. Specifically, in FIG. 8D, the lifting/lowering rotation driving unit 25 lifts and lowers (lowers in FIG. 8D) the two hands 21 and the forward/rearward driving unit 23 along the vertical axis AX1a, and rotates the two hands 21 and the forward/rearward driving unit 23 about the vertical axis AX1a. Accordingly, while the two hands 21 are moved to a position facing one or two substrates W to be taken next, the two hands 21 are oriented to face the one or two substrates W. Thereafter, the one or two substrates W are taken from the FOUP F.

Operations shown in FIGS. 8A to 8D are repeated until all the substrates W are taken from the FOUP F. In these operations, the two coating-treatment layers 31A and 31B of the treating block 3 illustrated in FIG. 1 are subjected to parallel treatment. Accordingly, in a case where two substrates W taken from the FOUP F are transported to the sending buffer unit SBF1, two substrates W that are taken next are transported to the sending buffer unit SBF2. Then, two substrates W that are taken next are transported to the sending buffer unit SBF1 again.

Substrates W are alternately distributed to the "sending buffer unit SBF1" and the "sending buffer unit SBF2." As illustrated in FIGS. 8A through 8C, the first substrate transportation mechanism 6A sequentially takes substrates W from a bottom level 86 of the FOUP F, and sequentially places the substrates W in the ascending order from the support plate 29B of the sending buffer unit SBF1.

Figure 8D:
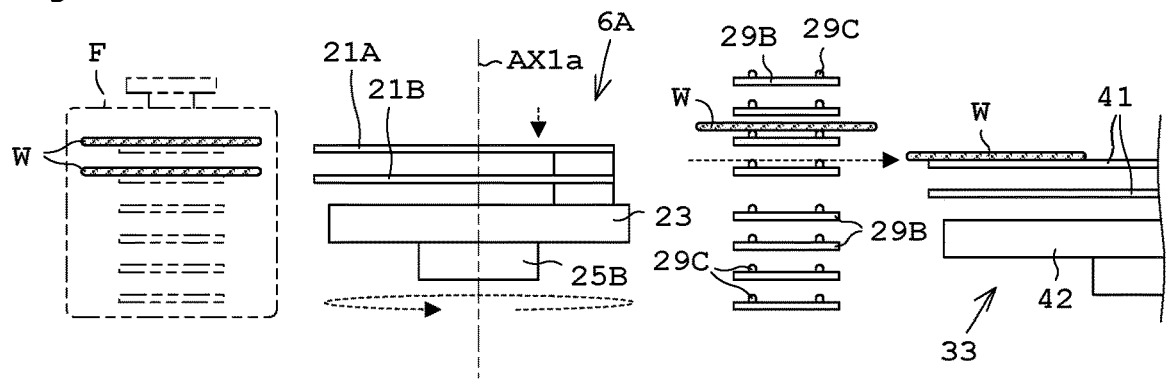

In FIG. 8D, the third substrate transportation mechanism 33 of the first coating-treatment layer 31A has received one substrate W placed on the support plates 29B of the sending buffer unit SBF1. The received substrate W is subjected to a predetermined treatment in the first coating-treatment layer 31A.

[Storage (Return) Operation of Substrate W by Second Substrate Transportation Mechanism 6B]

Figure 9A:
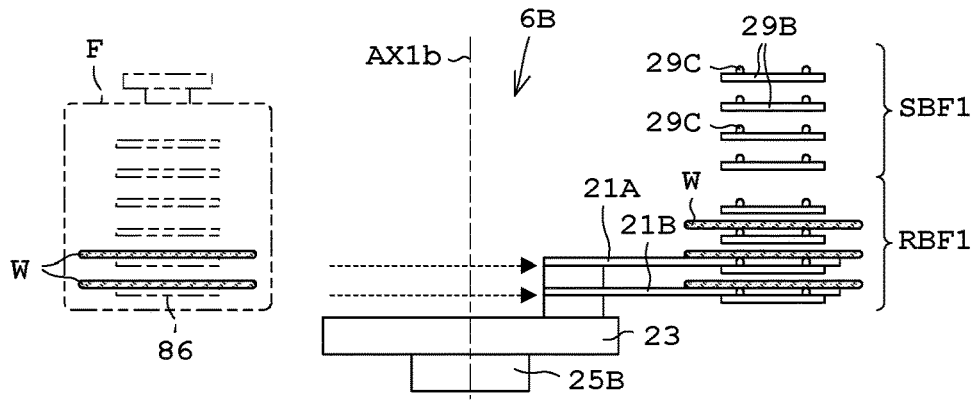
FIGS. 9A to 9D are illustrations for describing an operation of transporting substrates from a return buffer unit to a FOUP by a second substrate transportation mechanism.

In FIG. 9A, three substrates W are placed on the support plates 29B at the first to third levels from the bottom of the return buffer unit RBF1. The three substrates W are substrates W transported by the third substrate transportation mechanism 33 and subjected to the predetermined treatment in the first coating-treatment layer 31A. The forward/rearward driving unit 23 of the second substrate transportation mechanism 6B moves the two hands 21 forward to thereby cause the two hands 21 to enter a region of the return buffer unit RBF1. After the entering, two substrates W are picked up and held by the two hands 21. After picking up the two substrates W, the forward/rearward driving unit 23 moves the two hands 21 backward while holding the two substrates W.

After the two substrates W have been received from the return buffer unit RBF1, the received two substrates W are accommodated in the FOUP F placed on the opener 5C, for example. A specific operation will be described in order. The lifting/lowering rotation driving unit 25 lifts and lowers (lifts in FIG. 9B) the two hands 21 and the forward/rearward driving unit 23 along the vertical axis AX1b, and rotates the two hands 21 and the forward/rearward driving unit 23 about the vertical axis AX1b. Accordingly, while the two hands 21 are moved to a position facing accommodating spaces at the third and fourth levels from the bottom of the FOUP F to which the substrates W are transported, the two hands 21 are oriented toward the accommodating spaces.

Figure 9B:
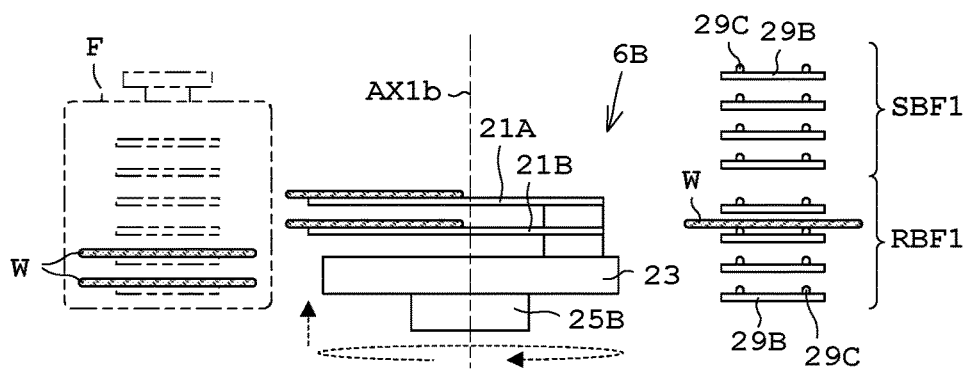
Figure 9C:
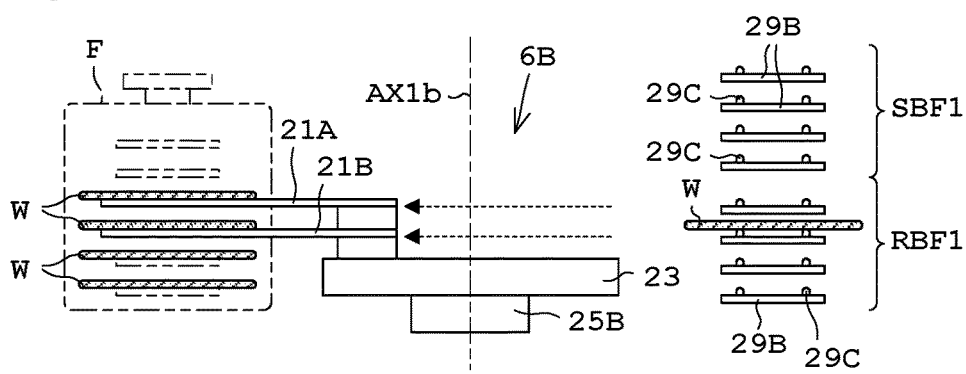

In FIG. 9C, the forward/rearward driving unit 23 moves the two hands 21 holding the two substrates W forward to thereby cause the two hands 21 to enter the FOUP F. After the entering, the two hands 21 places the two substrates W on the third and fourth levels from the bottom in the FOUP F. After the two substrates W have been placed, the forward/rearward driving unit 23 moves the two hands 21 holding no substrate W backward.

After the treated two substrates W have been accommodated in the FOUP F, one or two substrates W are received again from a return buffer unit except for the return buffer unit RBF1, such as the return buffer unit RBF2. That is, while the two hands 21 are moved to a position facing one or two substrates W to be taken next, the two hands 21 are oriented to face the one or two substrates W. Thereafter, the one or two substrates W are received.

Operations as illustrated in FIGS. 9A to 9D are repeated so that substrates W are accommodated in the FOUP F. At this time, parallel treatment is performed in the two coating-treatment layers 31A and 31B of the treating block 3 illustrated in FIG. 1. Thus, after two substrates W have been transported from the return buffer unit RBF1 to the FOUP F, two substrates W are transported from the return buffer unit RBF2 to the FOUP F. Then, two substrates W are transported from the return buffer unit RBF1 to the FOUP F again.

In the manner described above, substrates W are alternately returned from the "return buffer unit RBF1" and the "return buffer unit RBF2" to the FOUP F. As illustrated in FIGS. 9A through 9C, the second substrate transportation mechanism 6B sequentially receives substrates W in the ascending order from the return buffer unit SFB1, and sequentially accommodates the substrates W from the bottom level 86 of the FOUP F.

Once all the substrates W are accommodated in the FOUP F, the shutter 16 of the opener 5C closes the opening 14 while attaching the lid to the FOUP body. Thereafter, the shutter 16 of the opener 5C locks the lid of the FOUP F placed on the mount table 12 of the opener 5C to release holding of the lid. Subsequently, the FOUP transportation mechanism 62 transports the FOUP F from the opener 5C. The phrase "all the substrates W are accommodated in the FOUP F" refers to a state where 24 substrates W are accommodated in a case where 24 substrates W are accommodated in the FOUP F.

Figure 9D:
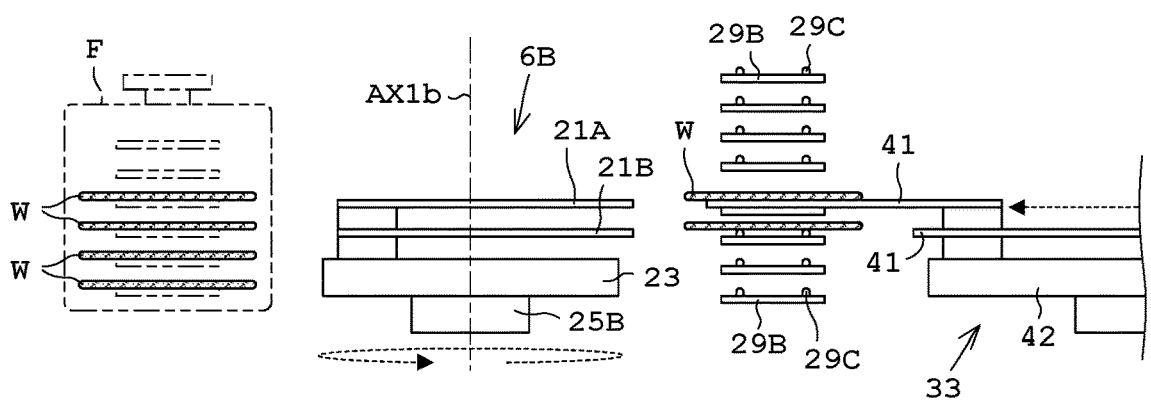

In FIG. 9D, the third substrate transportation mechanism 33 of the first coating-treatment layer 31A places one treated substrate W on the support plate 29B of the return buffer unit RBF1.

[Substrate Transportation on Two Openers 5A and 5B]

Next, an operation of the first substrate transportation mechanism 6A on two FOUPs FA and FB placed on the two openers 5A and 5B will be described.

The two openers 5A and 5B and the first substrate transportation mechanism 6A are previously configured to perform an operation of taking (sending) substrates W from a FOUP F, as a normal operation. Description will be given with reference to FIG. 3B. The first substrate transportation mechanism 6A takes a substrate W from a FOUP FA placed on the opener 5A. The substrate W taken from the FOUP FA is transported to the substrate buffer unit 7. Then, the first substrate transportation mechanism 6A takes all the substrates W from the FOUP FA. Here, supposing no opener 5B illustrated in FIG. 3B are provided. In this case, the first substrate transportation mechanism 6A is in a standby state until the FOUP FA of the opener 5A that has become empty is replaced by another FOUP F by the FOUP transportation mechanism 62. Thus, substrates W cannot be supplied to the treating block 3 anymore.

The FOUP buffer device 4, however, includes the opener 5B in addition to the opener 5A. Thus, after having taken all the substrates W from the FOUP FA of the opener 5A, the first substrate transportation mechanism 6A can start taking substrates W from a FOUP FB of the opener 5B. Accordingly, standby time of the first substrate transportation mechanism 6A can be reduced. In addition, the two openers 5A and 5B are disposed in the upward/downward direction along the lifting and lowering paths of the two hands 21 and the forward/rearward driving unit 23 of the first substrate transportation mechanism 6A. Thus, the two hands 21 and the forward/rearward driving unit 23, for example, do not need to be moved in the Y-direction, and thus, it is possible to move the two hands 21 of the first substrate transportation mechanism 6A while preventing a reduction of efficiency in transporting substrates W.

After having taken all the substrates W from the FOUP FB of the opener 5B, the first substrate transportation mechanism 6A starts taking substrates W from a third FOUP F placed on the opener 5A, instead of the FOUP FA. That is, the first substrate transportation mechanism 6A is configured to alternately take substrates W from the FOUP F placed on the opener 5A and the FOUP F placed on the opener 5B in units of FOUPs.

[Substrate Transportation on Two Openers 5C and 5D]

Next, an operation of the second substrate transportation mechanism 6B on two FOUPs FC and FD placed on the two openers 5C and 5D will be described.

The two openers 5C and 5D and the second substrate transportation mechanism 6B are previously configured to perform an operation of accommodating (returning) substrates W in a FOUP F, as a normal operation. Description will be given with reference to FIG. 3B. The second substrate transportation mechanism 6B accommodates all the substrates W received from the substrate buffer unit 7 in the FOUP FC placed on the opener 5C. Here, supposing the opener 5D illustrated in FIG. 3B is not provided. In this case, the second substrate transportation mechanism 6B is in a standby state until the FOUP FC (accommodating all the treated substrates W) placed on the opener 5C is replaced by another FOUP F by the FOUP transportation mechanism 62. Accordingly, substrates W treated by the treating block 3 cannot be accommodated in the FOUP F anymore.

The FOUP buffer device 4, however, includes the opener 5D in addition to the opener 5C. Thus, after having taken all the treated substrates W in the FOUP FC of the opener 5C, the second substrate transportation mechanism 6B can start accommodating substrates W in the FOUP FD of the opener 5D. Accordingly, standby time of the second substrate transportation mechanism 6B can be reduced. In addition, the two openers 5C and 5D are disposed in the upward/downward direction along the lifting and lowering paths of the two hands 21 and the forward/rearward driving unit 23 of the second substrate transportation mechanism 6B. Thus, the two hands 21 and the forward/rearward driving unit 23, for example, do not need to be moved in the Y-direction, and thus, it is possible to move the two hands 21 of the second substrate transportation mechanism 6B while preventing a reduction of efficiency in transporting substrates W.

After all the substrates W have been accommodated in the FOUP FD of the opener 5D, the second substrate transportation mechanism 6B starts accommodating the substrates W in the third FOUP F placed on the opener 5C. That is, the second substrate transportation mechanism 6B is configured to alternately accommodate substrates W in the FOUP F placed on the opener 5C and the FOUP F placed on the opener 5D in units of FOUPs.

[Replacing Operation of Two FOUPs F by FOUP Transportation Mechanism 62]

Next, a replacing operation of two FOUPs F by the two grippers 65A and 65B of the FOUP transportation mechanism 62 will be described. The FOUP F placed in each of the four openers 5A to 5D is replaced by another FOUP F. In this case, to transport FOUPs efficiently, the replacing operation is performed by using the two grippers 65A and 65B of the FOUP transportation mechanism 62. Conveyance except for the four openers 5A to 5D, such as FOUP transportation from the input port IP1 to the untreated substrate FOUP shelf IB1 is performed by using one of the two grippers 65A and 65B.

Figure 10A:
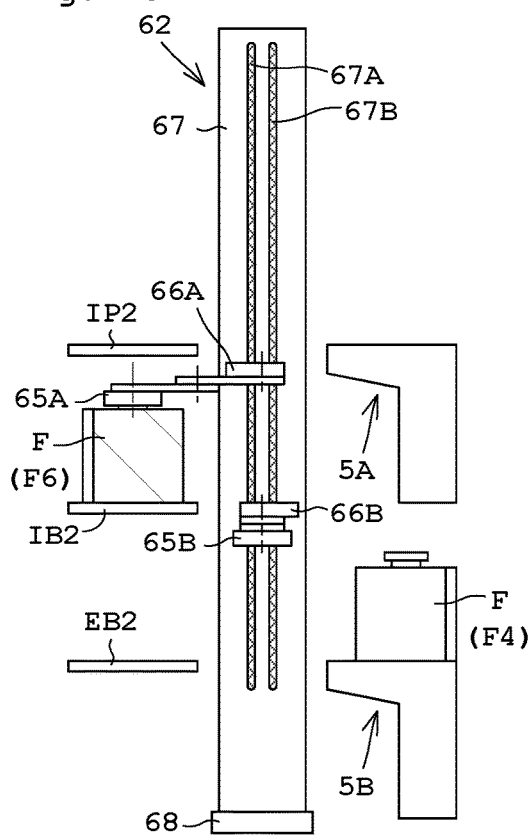
FIGS. 10A to 10D are illustrations for describing an operation of replacing two FOUPs by the FOUP transportation mechanism.

In FIG. 10A, the FOUP transportation mechanism 62 grasps an untreated FOUP F6 (indicated by hatching) placed on the untreated substrate FOUP shelf IB2 with the upper gripper 65A. Then, the FOUP transportation mechanism 62 moves the grasped untreated FOUP F6 to a transportation space between the untreated substrate FOUP shelf IB2 (shelves 61) and the four openers 5A to 5D, by using the articulated arm 66A and the driving unit 67A.

Figure 10B:
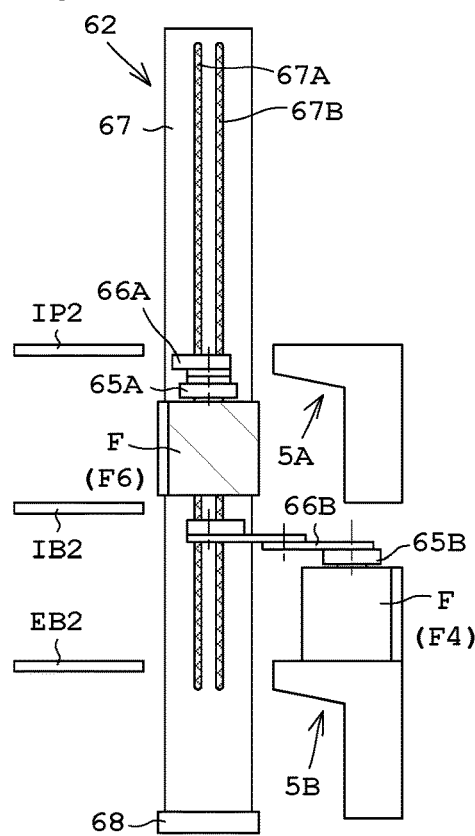

In FIG. 10B, the FOUP transportation mechanism 62 grasps the empty FOUP F4 placed on the opener 5B, by using the lower gripper 65B. Thereafter, the FOUP transportation mechanism 62 moves the grasped empty FOUP F4 from the opener 5B to the transportation space, by using the articulated arm 66B and the driving unit 67B. The upper gripper 65A has been moved to a position at which the untreated FOUP F6 does not collide with, for example, the lower gripper 65B.

Figure 10C:
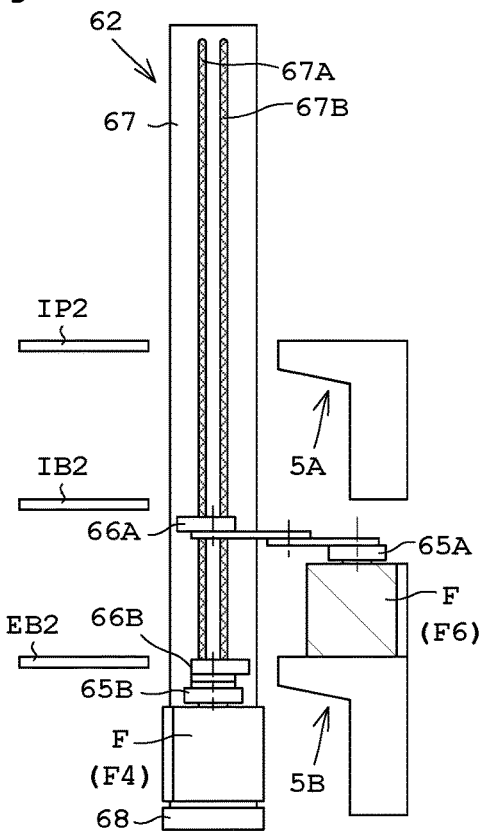

In FIG. 10C, the FOUP transportation mechanism 62 places the untreated FOUP F6 grasped by the upper gripper 65A on the opener 5B, instead of the empty FOUP F4. Subsequently, the FOUP transportation mechanism 62 cancels grasping by the upper gripper 65A. The upper gripper 65A is moved to the transportation space. The lower gripper 65B has been moved to a position at which the lower gripper 65B does not collide with the FOUP F6 grasped by the upper gripper 65A.

Figure 10D:
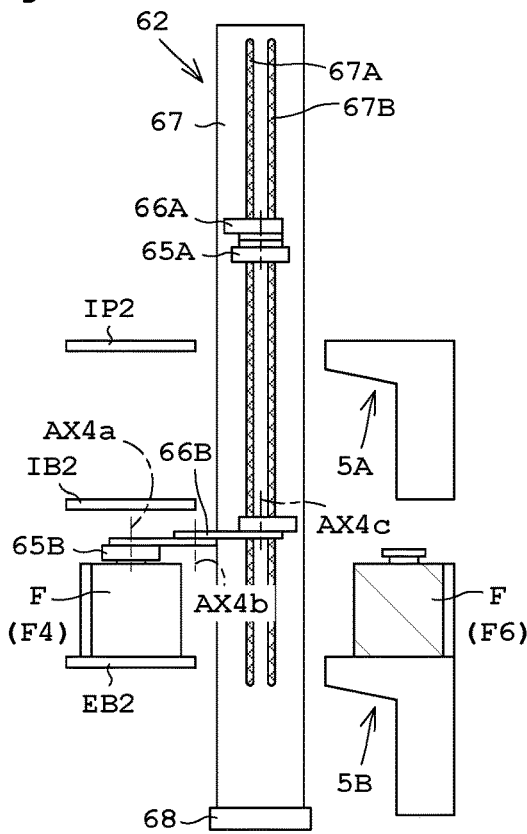

In FIG. 10D, the FOUP transportation mechanism 62 places the empty FOUP F4 grasped by the lower gripper 65B on, for example, an empty FOUP shelf EB2. Then, the FOUP transportation mechanism 62 cancels grasping by the lower gripper 65B. In this manner, FOUPs F can be efficiently transported by performing a replacing operation. In this description, the untreated FOUP F6 grasped by the upper gripper 65A, and the empty FOUP F4 is grasped by the lower gripper 65B. Alternatively, these FOUPs may be held in opposite manner. Specifically, the untreated FOUP F6 may be grasped by the lower gripper 65B with the empty FOUP F4 being grasped by the upper gripper 65A.

[Operation Example 1 of FOUP Buffer Device 4]

Figure 11:
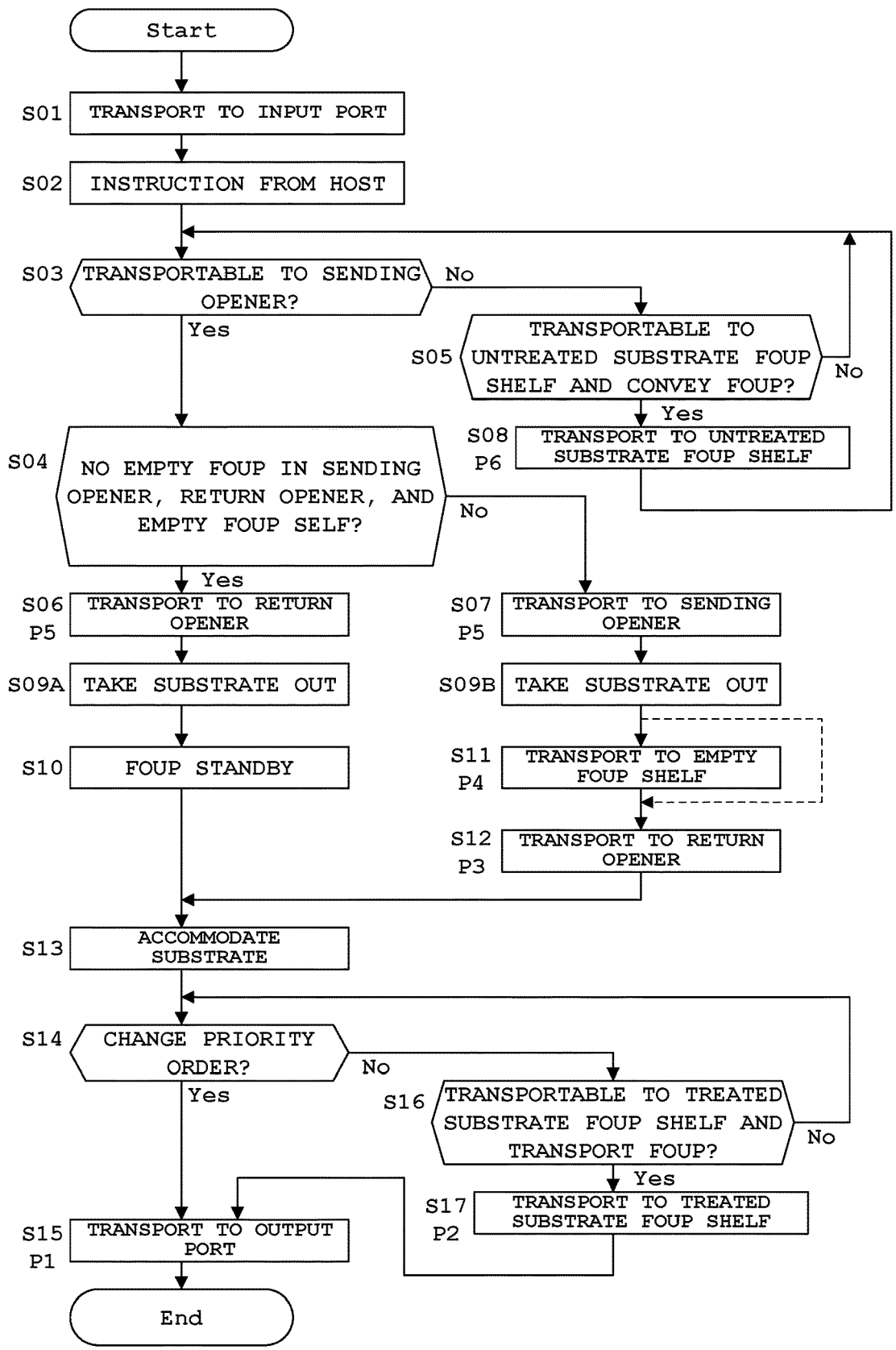
FIG. 11 is a flowchart for depicting a FOUP transportation and a substrate transportation from an input port to an output port.

Next, an operation of the FOUP buffer device 4 will be described with reference to a flowchart of FIG. 11. FIG. 11 is a flowchart for depicting a transportation of a FOUP F1 from an input port to an output port and a substrate transportation. The "FOUP F1" refers to a predetermined FOUP F. That is, description will be focused on the "FOUP F1" and FOUP transportation, for example, will be described using the "FOUP F1" as an example. In a case where a FOUP that is not the predetermined FOUP F1 will be represented as a "FOUP F." FIG. 12 is a table showing an operation priority order of the FOUP buffer device 4.

In the following description, an opener for taking substrates W will be referred to as a "sending opener" and an opener for accommodating substrates W will be referred to as "return opener."

The external transportation mechanism OHT transports the FOUP F1 to, for example, the input port IP1 (step S01). The substrate treating apparatus 1 receives an instruction to execute a treatment on a substrate W accommodated in the FOUP F1 from a host computer of a factory (step S02).

The control units 71 of the substrate treating apparatus 1 determines whether the FOUP F1 of the input port IP1 can be transported to one of the two sending openers 5A and 5B (step S03). In this determination, determination on whether the FOUP F is placed on each of the openers 5A and 5B is performed based on a current position of the FOUP F managed by schedule management software (scheduler) or information of, for example, an optical sensor placed on the mount table 12 of each of the sending openers 5A and 5B. Such a determination method is performed similarly to the case of the two return openers 5C and 5D and the shelves 61. The schedule management software is executed by the control units 71 of the substrate treating apparatus 1.

As a result of the determination, if the FOUP F1 can be transported to at least one of the two sending openers 5A and 5B, the process proceeds to step S04, and otherwise, the process proceeds to step S05.

In step S04, the control unit 71 further determines whether the current state satisfies all the conditions where the FOUP F is not placed on any of the sending openers 5A and 5B, where the FOUP F is not placed on at least one of the return openers 5C and 5D, and where FOUPs F (including an empty FOUP) are not placed on any of the four empty FOUP shelves EB1 to EB4 or not. As a result of determination, if all the conditions are satisfied (see, for example, FIGS. 13A, 13B, and 17C described later), the FOUP transportation mechanism 62 transports the FOUP F1 from the input port IP1 not to the sending openers 5A and 5B but to the transportable return opener (e.g., 5C) on which no FOUP F is placed (step S06). In accordance with the scheduler of the substrate treating apparatus 1 and the operation priority order of the FOUP buffer device 4 (see FIG. 12), it is previously set that the FOUP F1 is transported to the sending opener 5A (5B), and after all the substrates W are taken out, and the FOUP F1 is transported to the return opener 5C (5D).

As a result of the determination in step S04, if at least one of the conditions is not satisfied, the FOUP transportation mechanism 62 transports the FOUP F1 from the input port IP1 to one of the sending openers 5A and 5B to which the FOUP F1 can be transported (step S07).

On the other hand, in step S03, if other FOUPs F are placed on both of the sending openers 5A and 5B and the FOUP F1 cannot be transported, the control unit 71 determines whether the FOUP F1 can be transported to one of the two untreated substrate FOUP shelves IB1 and IB2 and whether to transport the FOUP F1 (step S05). Since other FOUPs F are placed on both of the two untreated substrate FOUP shelves IB1 and IB2, if the FOUP F1 cannot be transported to any of the shelves IB1 and IB2, the FOUP F1 is kept in a standby state in the input port IP1. If the control unit 71 determines not to transport the FOUP F1, the FOUP F1 is also kept in a standby state in the input port IP1. If the FOUP F1 can be transported and the control unit 71 determines to transport the FOUP F1, the FOUP transportation mechanism 62 transports the FOUP F1 to one of the two untreated substrate FOUP shelves IB1 and IB2 (step S08).

If the FOUP F1 is placed on one of the return openers 5C and 5D, in step S09A, a substrate W is taken from the FOUP F1 and is transported to the substrate buffer unit 7. In general, the two return openers 5C and 5D are used for accommodating substrates W in a FOUP F. However, in a case where substrates W can be smoothly transported (conditions in step S04 are satisfied), substrates W yet to be treated are taken from an untreated substrate FOUP F placed on one of the return openers 5C and 5D. Accordingly, until all the treated substrates W are accommodated, the FOUP F1 placed on the opener 5C is not moved and can be kept, for example, (step S10). Thus, the FOUP transportation mechanism 62 can transport other FOUPs F, transportation efficiency of FOUPs F can be enhanced.

On the other hand, if the FOUP F1 is placed on one of the sending openers 5A and 5B, in step S09B, a substrate W is taken from the FOUP F1 and is transported to the substrate buffer unit 7. After the first substrate transportation mechanism 6A has taken all the substrates W from the FOUP F1, the empty FOUP F1 is transported from the sending opener 5A to one of the four empty FOUP shelves EB1 to EB4 (step S11). For example, at the time when the first substrate W treated in the treating block 3 returns to the substrate buffer unit 7, the FOUP F1 is transported from one of the four empty FOUP shelves EB1 to EB4 to one of the two return openers 5C and 5D to which the FOUP F1 can be transported (step S12). The FOUP F1 that has become empty in step S09B may be directly transported to one of the return openers 5C and 5D without interposition of the four empty FOUP shelves EB1 to EB4.

In step S13, the second substrate transportation mechanism 6B accommodates the treated substrate W in the empty FOUP F1 placed on the return opener 5C, for example. That is, the treated substrate W returned to the substrate buffer unit 7 is transported to the empty FOUP F1. In a case where all the substrates W are accommodated in the empty FOUP F1, if an output instruction is previously issued from the host computer (if an operation priority order of first-in first-out (FIFO) is changed), the FOUP F1 accommodating the treated substrate W is transported to one of the two output ports OP1 and OP2 (steps S14 and S15).

If no output instruction is issued from the host computer, the control unit 71 determines whether the FOUP F1 can be transported to one of the two treated substrate FOUP shelves OB1 and OB2 and whether to transport the FOUP F1 (step S16). If the FOUP F1 cannot be transported or if the control unit 71 determines not to transport the FOUP F1, the FOUP F1 is kept in the return opener 5C, whereas if the FOUP F1 can be transported and the control unit 71 determines to transport the FOUP F1, the FOUP transportation mechanism 62 transports the FOUP F1 from the return opener 5C to one of the two treated substrate FOUP shelves OB1 and OB2 (step S17).

The FOUP F1 transported to the treated substrate FOUP shelf OB1 (OB2) is transported to one of the two output ports OP1 and OP2 in accordance with the operation priority order of FIFO (step S15). The FOUP F1 transported to the output port OP1 (OP2) is transported from the output port OP1 (OP2) to a next device by the external transportation mechanism OHT.

FIG. 12 is a table showing an operation priority order of the FOUP buffer device 4. As shown in FIG. 12, a downstream return operation is performed with priority to an upstream sending operation. Characters P1 to P6 in FIG. 11 respectively correspond to priorities 1 to 6 in FIG. 12. The order of starting a treatment on a FOUP F (priority order) and the order of output from the apparatus 1 are determined based on an instruction from the host computer, and are basically determined in accordance with first-in first-out (FIFO). The operation priority order shown FIG. 12 is applied to a case where the FOUP transportation mechanism 62 includes only one gripper, or a case where the FOUP transportation mechanism 62 includes a plurality of grippers but one gripper is used to transport a FOUP F without the replacing operation by the two grippers 65A and 65B described above. Thus, in the case of the replacing operation by the four openers 5A to 5D as described in this embodiment, the priority order is reversed, for example, and the operation priority order shown in FIG. 12 is not applied.

[Operation Example 2 of FOUP Buffer Device 4]

Next, an operation example in the case of transporting a plurality of FOUPs F will be described. In this transportation, the operation of the flowchart shown in FIG. 11 is applied, and the operation priority order shown in FIG. 12 is partially applied.

The external transportation mechanism OHT sequentially supplies a plurality of FOUPs F. The external transportation mechanism OHT transports the FOUPs F to one of the two input ports IP1 and IP2 except for a case where the FOUPs F cannot be transported to any of the two input ports IP1 and IP2. The FOUPs F are numbered in the order of transportation from the external transportation mechanism OHT to one of the input ports IP1 and IP2. For example, the second FOUP F is represented as "F2," and the fifth FOUP F is represented as "F5." In FIGS. 13A to 13D, for example, the FOUP F1 is represented as "1," for example, for convenience of illustration.

Figure 13A:
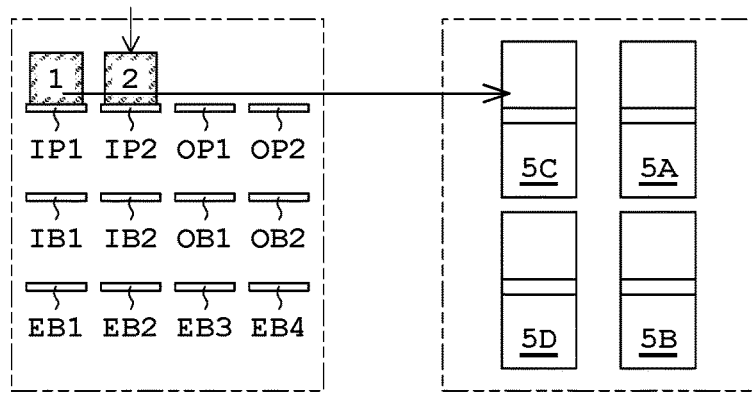
FIGS. 13A to 13D are illustrations for describing a FOUP transportation.

In FIG. 13A, the FOUP F1 is transported to the input port IP1, and the FOUP F2 is transported to the input port IP2. The FOUP transportation mechanism 62 transports the FOUP F1 from the input port IP1 to the return opener 5C (priority 5).

Figure 13B:
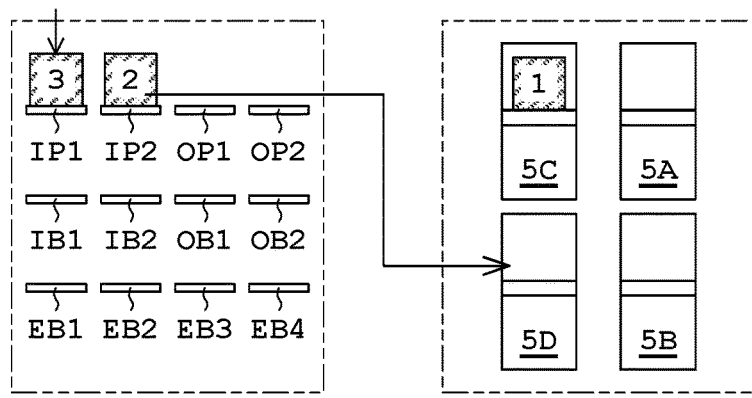

In FIG. 13B, the FOUP transportation mechanism 62 transports the FOUP F2 from the input port IP2 to the return opener 5D (priority 5). The input port IP1 receives the FOUP F3 from the external transportation mechanism OHT. The second substrate transportation mechanism 6B starts taking a substrate W from the FOUP F1 placed on the return opener 5C. Conveyance of substrates W is performed in parallel with transportation of FOUPs F.

Figure 13C:
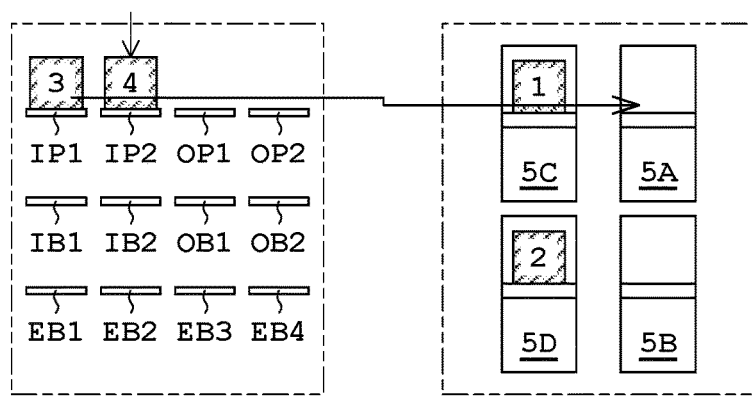

In FIG. 13C, the FOUP transportation mechanism 62 transports the FOUP F3 from the input port IP1 to the sending opener 5A (priority 5). The input port IP2 receives the FOUP F4 from the external transportation mechanism OHT. The second substrate transportation mechanism 6B continues to take substrates W from the FOUP F1 placed on the return opener 5C. Since the second substrate transportation mechanism 6B is taking the substrates W from the FOUP F1, the FOUP F2 waits for being taken out.

Figure 13D:
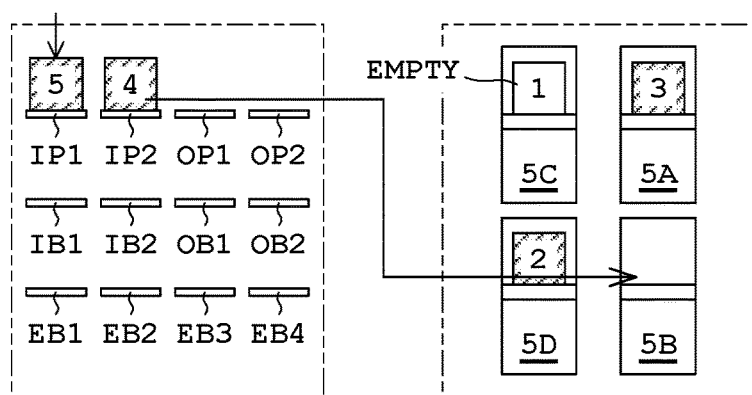

In FIG. 13D, the FOUP transportation mechanism 62 transports the FOUP F4 from the input port IP2 to the sending opener 5B (priority 5). The input port IP1 receives the FOUP F5 from the external transportation mechanism OHT. The second substrate transportation mechanism 6B finishes taking all the substrates W from the FOUP F1 placed on the return opener 5C. Thereafter, the second substrate transportation mechanism 6B starts taking substrates W from the FOUP F2 placed on the return opener 5D. It is known (calculated) by the schedule management software executed by the control unit 71 that substrates W accommodated in the FOUP F1 placed on the return opener 5C return to the substrate buffer unit 7 first after treatment by the treating block 3. Thus, the empty FOUP F1 from which all the substrates W have been taken is kept on the return opener 5C.

A treatment is to be performed by the treating block 3 in the order of the "FOUP F1," the "FOUP F2," the "FOUP F3," and the "FOUP F4." The second substrate transportation mechanism 6B is being taking substrates W from the FOUP F2. Thus, the FOUP F3 waits for being taken out.

Figure 14A:
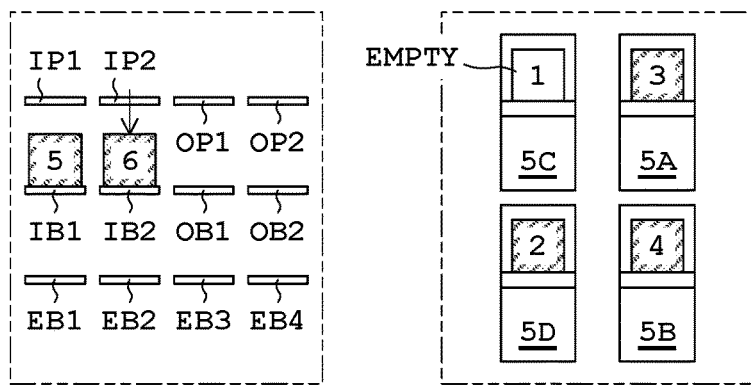
FIGS. 14A to 14D are illustrations for describing a FOUP transportation subsequent to the process illustrated in FIG. 13D.

In FIG. 14A, since the four openers 5A to 5D are filled with the four FOUPs F1 to F4, the FOUP transportation mechanism 62 transports the FOUP F5 from the input port IP1 to the untreated substrate FOUP shelf IB1 (priority 6). For the same reason, after the input port IP2 has received the FOUP F6 from the external transportation mechanism OHT, the FOUP transportation mechanism 62 transports the FOUP F6 from the input port IP2 to the untreated substrate FOUP shelf IB2 (priority 6).

Figure 14B:
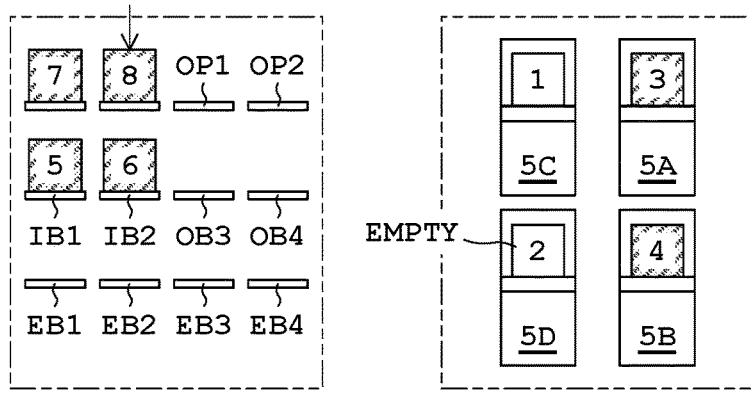

In FIG. 14B, the two input ports IP1 and IP2 receive FOUPs F7 and F8 from the external transportation mechanism OHT. The four openers 5A to 5D and the two untreated substrate FOUP shelves IB1 and IB2 are filled with six FOUPs F1 to F6. Thus, the FOUP buffer device 4 does not accommodate FOUPs F anymore. Accordingly, the external transportation mechanism OHT stops supply of FOUPs F until one of the two input ports IP1 and IP2 becomes capable of transporting FOUPs.

The second substrate transportation mechanism 6B finishes taking all the substrates W from the FOUP F2 placed on the return opener 5D. Thereafter, the first substrate transportation mechanism 6A starts taking substrates W from the FOUP F3 placed on the sending opener 5A. It is known by the schedule management software executed by the control unit 71 that substrates W accommodated in the FOUP F2 placed on the return opener 5D return to the substrate buffer unit 7 secondly after treatment by the treating block 3. Thus, the empty FOUP F2 from which all the substrates W have been taken is kept on the return opener 5D.

Figure 14C:
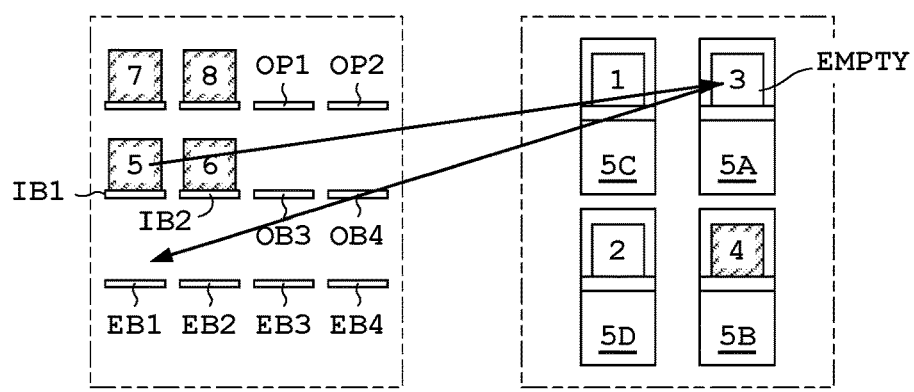

In FIG. 14C, the first substrate transportation mechanism 6A finishes taking all the substrates W from the FOUP F3 placed on the sending opener 5A. Thereafter, the first substrate transportation mechanism 6A starts taking substrates W from the FOUP F4 placed on the sending opener 5B. To perform a treatment continuously, the substrate treating apparatus 1 transports an empty FOUP F3 from the sending opener 5A to the empty FOUP shelf EB1, and a FOUP F5 placed on the untreated substrate FOUP shelf IB1 to the sending opener 5A.

First, the FOUP transportation mechanism 62 grasps the FOUP F5 on the untreated substrate FOUP shelf IB1 with the upper gripper 65A and moves the FOUP F5 from the untreated substrate FOUP shelf IB1. The lower gripper 65B does not grasp the FOUP F. Thereafter, the FOUP transportation mechanism 62 replaces the empty FOUP F3 by the FOUP F5 in the sending opener 5A. Specifically, the FOUP transportation mechanism 62 grasps the empty FOUP F3 in the sending opener 5A with the lower gripper 65B, and moves the FOUP F3 from the sending opener 5A. Thereafter, the FOUP transportation mechanism 62 places the FOUP F5 on the sending opener 5A with the upper gripper 65A. After having placed the FOUP F5, the FOUP transportation mechanism 62 places the empty FOUP F3 on the empty FOUP shelf EB1 with the lower gripper 65B.

Figure 14D:
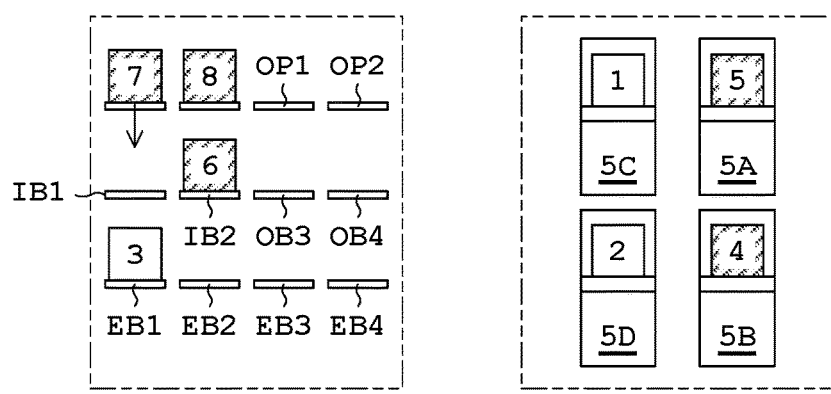

In FIG. 14D, since the two sending openers 5A and 5B are filled with the two FOUPs F5 and F4, the FOUP transportation mechanism 62 transports the FOUP F7 from the input port IP1 to the untreated substrate FOUP shelf IB1 (priority 6).

Figure 15A:
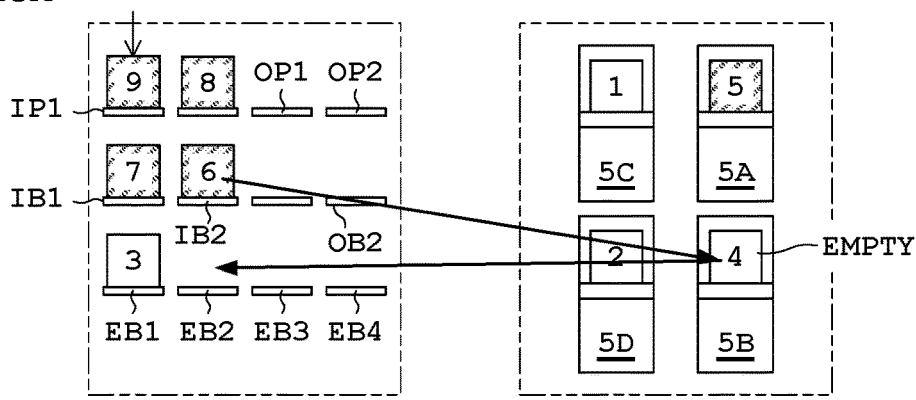
FIGS. 15A to 15D are illustrations for describing a FOUP transportation subsequent to the process illustrated in FIG. 14D.

In FIG. 15A, the first substrate transportation mechanism 6A finishes taking all the substrates W from the FOUP F4 placed on the sending opener 5B. Thereafter, the first substrate transportation mechanism 6A starts taking substrates W from the FOUP F5 placed on the sending opener 5A. To perform a treatment continuously, the substrate treating apparatus 1 transports the empty FOUP F4 from the sending opener 5B to the empty FOUP shelf EB2, and the FOUP F6 placed on the untreated substrate FOUP shelf IB2 to the sending opener 5D.

First, the FOUP transportation mechanism 62 grasps the FOUP F6 on the untreated substrate FOUP shelf IB2 with the upper gripper 65A and moves the FOUP F6 from the untreated substrate FOUP shelf IB2. The lower gripper 65B does not grasp any FOUP F. Thereafter, the FOUP transportation mechanism 62 replaces the empty FOUP F4 by the FOUP F6 in the sending opener 5B. Specifically, the FOUP transportation mechanism 62 grasps the empty FOUP F4 in the sending opener 5B with the lower gripper 65B, and moves the FOUP F4 from the sending opener 5B. Thereafter, the FOUP transportation mechanism 62 places the FOUP F6 on the sending opener 5B with the upper gripper 65A. After having placed the FOUP F6, the FOUP transportation mechanism 62 places the empty FOUP F4 on the empty FOUP shelf EB2 with the lower gripper 65B.

Figure 15B:
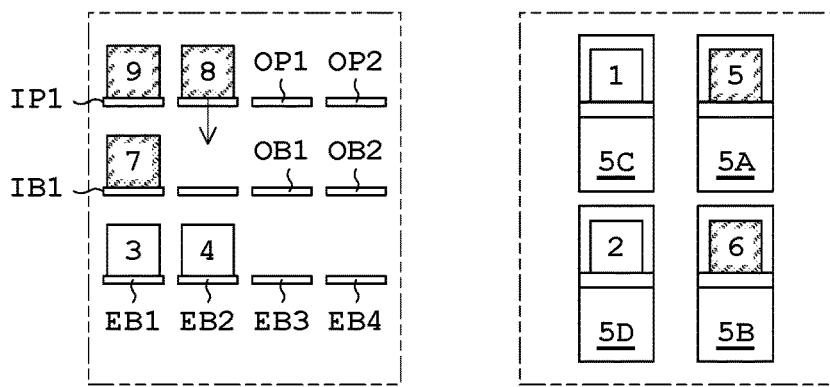

In FIG. 15B, since the two sending openers 5A and 5B are filled with the two FOUPs F5 and F6, the FOUP transportation mechanism 62 transports the FOUP F8 from the input port IP2 to the untreated substrate FOUP shelf IB2 (priority 6).

Figure 15C:
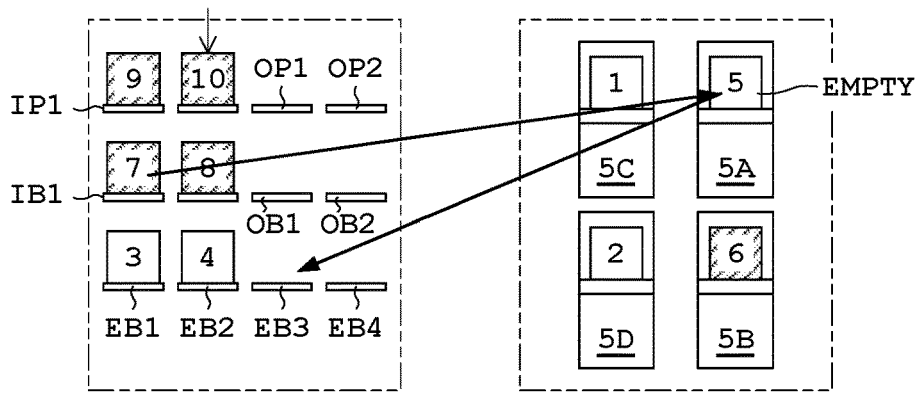

In FIG. 15C, the first substrate transportation mechanism 6A finishes taking all the substrates W from the FOUP F5 placed on the sending opener 5A. Thereafter, the first substrate transportation mechanism 6A starts taking substrates W from the FOUP F6 placed on the sending opener 5B. The FOUP transportation mechanism 62 transports the empty FOUP F5 to the empty FOUP shelf EB3.

First, the FOUP transportation mechanism 62 grasps the FOUP F7 on the untreated substrate FOUP shelf IB1 with the upper gripper 65A and moves the FOUP F7 from the untreated substrate FOUP shelf IB1. The lower gripper 65B does not hold any FOUP F. Thereafter, the FOUP transportation mechanism 62 replaces the empty FOUP F5 by the FOUP F7 in the sending opener 5A. Specifically, the FOUP transportation mechanism 62 grasps the empty FOUP F5 in the sending opener 5A with the lower gripper 65B, and moves the FOUP F5 from the sending opener 5A. Thereafter, the FOUP transportation mechanism 62 places the FOUP F7 on the sending opener 5A with the upper gripper 65A. After having placed the FOUP F7, the FOUP transportation mechanism 62 places the empty FOUP F5 on the empty FOUP shelf EB3 with the lower gripper 65B. The input port IP2 receives the FOUP F10 from the external transportation mechanism OHT.

In FIG. 13D, taking of all the substrates W from the FOUP F1 is finished. The taken substrates W are sent to the treating block 3 through the substrate buffer unit 7. The treating block 3 performs a predetermined treatment on the substrates W. The treated substrates W subjected to the predetermined treatment by the treating block 3 are returned to the substrate buffer unit 7 by the third substrate transportation mechanism 33. The second substrate transportation mechanism 6B accommodates the substrates W returned to the substrate buffer unit 7 in the FOUP F1.

Figure 15D:
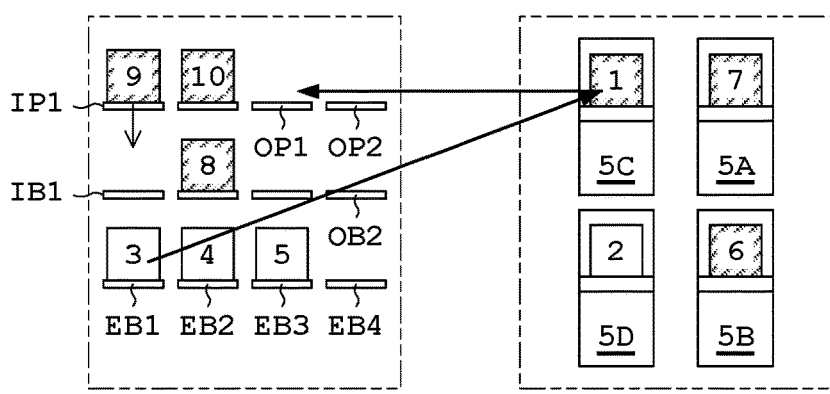

In FIG. 15D, the second substrate transportation mechanism 6B accommodates all the treated substrates W in the FOUP F1 placed on the return opener 5C. The second substrate transportation mechanism 6B starts accommodating substrates W in the FOUP F2 placed on the return opener 5D. Subsequently, if all the treated substrates W are accommodated in the FOUP F2 placed on the return opener 5D, accommodating of the treated substrates W in the FOUP F3 placed on the return opener 5C stats.

The FOUP transportation mechanism 62 transports the treated FOUP F1 to the output port OP1. First, the FOUP transportation mechanism 62 grasps the empty FOUP F3 placed on the empty FOUP shelf EB1 with the upper gripper 65A and moves the empty FOUP F3 from the empty FOUP shelf EB1. The lower gripper 65B does not hold any FOUP F. Thereafter, in the return opener 5C, the FOUP transportation mechanism 62 replaces the FOUP F1 accommodating treated substrates W by the empty FOUP F3. Specifically, the FOUP transportation mechanism 62 grasps the FOUP F1 of the return opener 5C with the lower gripper 65B and moves the FOUP F1 from the return opener 5C. Thereafter, the FOUP transportation mechanism 62 places the FOUP F3 on the sending opener 5C with the upper gripper 65A. After having placed the empty FOUP F3, the FOUP transportation mechanism 62 places the treated FOUP F1 on the output port OP1 with the lower gripper 65B.

Since the two sending openers 5A and 5B are filled with the two FOUPs F7 and F6, the FOUP transportation mechanism 62 transports the FOUP F9 from the input port IP1 to the untreated substrate FOUP shelf IB1 (priority 6).

Figure 16:
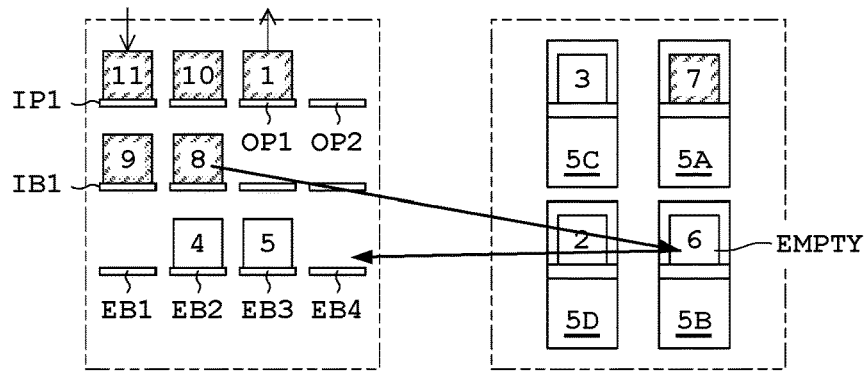
FIG. 16 is an illustration for describing a FOUP transportation subsequent to the process illustrated in FIG. 15D.

In FIG. 16, the FOUP F1 placed on the output port OP1 is transported by the external transportation mechanism OHT from the output port OP1.

Figure 17A:
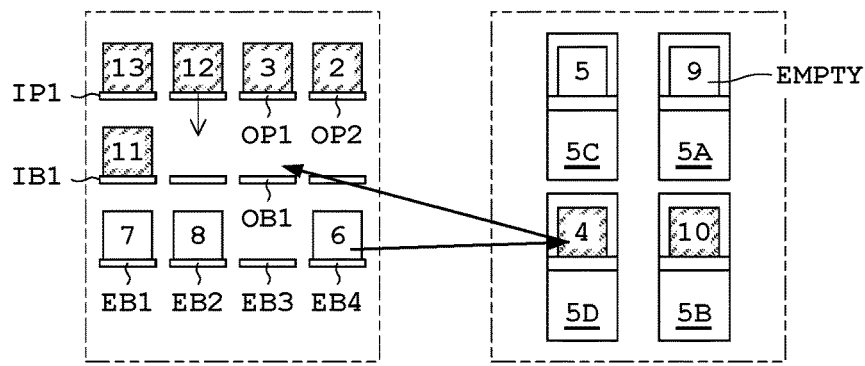
FIGS. 17A to 17C are illustrations for describing another FOUP transportation.

In FIG. 17A showing a state after FIG. 16, if the FOUP F4 accommodating treated substrates W cannot be transported to any of the two output ports OP1 and OP2, the FOUP transportation mechanism 62 transports the FOUP F4 from the return opener 5D to one of the two treated substrate FOUP shelves OB1 and OB2 (e.g., OB1). In this case, to transport FOUPs efficiently, the FOUP transportation mechanism 62 replaces the FOUP F4 by the empty FOUP F6 with the two grippers 65A and 65B in the return opener 5D.

Figure 17B:
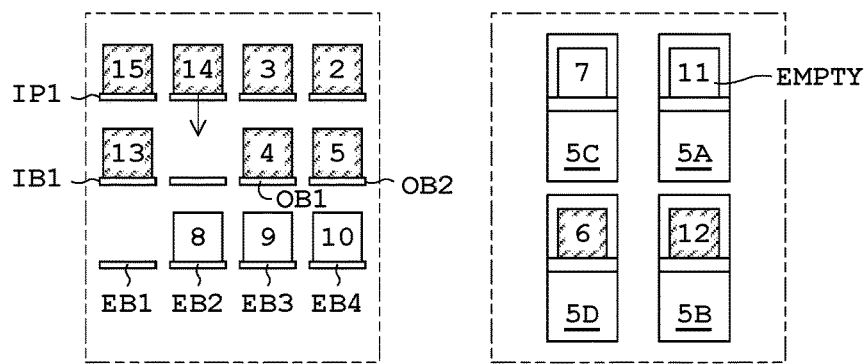

In addition, in FIG. 17B showing a state after FIG. 17A, if the FOUP F6 accommodating treated substrates W cannot be transported to any of the two output ports OP1 and OP2 and the two treated substrate FOUP shelves OB1 and OB2, the FOUP F6 cannot be transported anymore. Thus, until one of the two treated substrate FOUP shelves OB1 and OB2 becomes empty or until one of the two output ports OP1 and OP2 becomes empty and higher priority is given than FOUPs F4 and F5, the FOUP F6 is kept in a standby state in the return opener 5D.

Figure 17C:
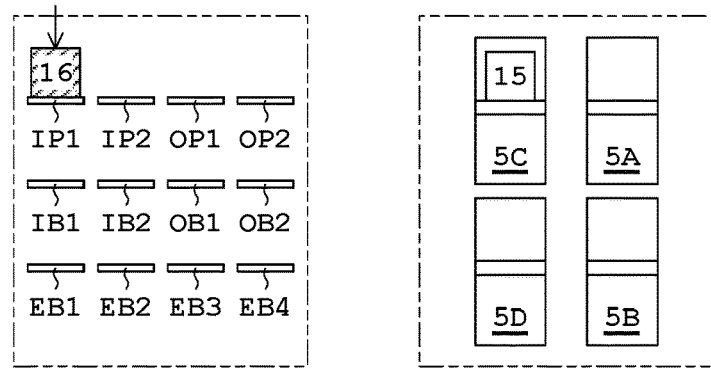

Furthermore, when a time has elapsed from the state shown in FIG. 17B and the input port IP1 receives the FOUP F16, transportation of the FOUP F16 not to the sending openers 5A and 5B but to the return opener 5D enhances efficiency in transporting FOUPs. That is, as shown in FIG. 17C, if the current state satisfies all the conditions where no FOUP F is placed on any of the two sending openers 5A and 5B, where the FOUP F is not placed on one of the two return openers 5C and 5D, and where the FOUP F is not placed on any of the four empty FOUP shelves EB1 to EB4, the FOUP transportation mechanism 62 transports the FOUP F16 to one of the two return openers 5C and 5D (return opener 5D in FIG. 17C) on which no FOUP is placed. In this case, after all the treated substrates W are accommodated in the FOUP F15 placed on the return opener 5C, taking substrates W from the return opener 5D starts.

In this embodiment, the first substrate transportation mechanism 6A is set to transport substrates W from the FOUP F placed on each of the two sending openers 5A and 5B to the substrate buffer unit 7. The second substrate transportation mechanism 6B is set to transport substrates W from the substrate buffer unit 7 to the FOUP F placed on each of the two return openers 5C and 5D. If the current state satisfies all the conditions where the FOUP is not placed on any of the two sending openers 5A and 5B, where the FOUP F is not placed on at least one of the two return openers 5C and 5D, and where the FOUP F is not placed on any of the four empty FOUP shelves EB1 to EB4, the FOUP transportation mechanism 62 transports a specific FOUP F to one of the two return openers 5C and 5D. Here, examples of the specific FOUP F include the FOUP F1 in FIG. 13A, the FOUP F2 in FIG. 13B, and the FOUP F16 in FIG. 17C. The second substrate transportation mechanism 6B is set to transport substrates W from the substrate buffer unit 7 to the FOUP F. The second substrate transportation mechanism 6B, however, transports substrates W from the specific FOUP F to the substrate buffer unit 7, and then transports treated substrates W treated by the treating block 3 from the substrate buffer unit 7 to the specific FOUP F. The FOUP transportation mechanism 62 allows the specific FOUP F to remain at a placement position of the specific FOUP F (e.g., the sending opener 5C in the case of the FOUP F1) from when all the substrates W are taken from the specific FOUP F by the second substrate transportation mechanism 6B to when all the treated substrates W are accommodated in the specific FOUP F.

In general, the second substrate transportation mechanism 6B is configured to transport substrates W from the substrate buffer unit 7 to a FOUP F placed on the opener 5C (5D). However, if a predetermined condition is satisfied, the second substrate transportation mechanism 6B transports substrates W from the FOUP F to the substrate buffer unit 7. That is, the second substrate transportation mechanism 6B performs an operation different from an ordinary substrate transportation operation. Accordingly, the second substrate transportation mechanism 6B can leave the specific FOUP F at a placement position of the specific FOUP F (opener 5C (5D)) from when all the substrates W are taken from the specific FOUP F to when all the treated substrates W are accommodated in the specific FOUP F. Accordingly, the FOUP transportation mechanism 62 can transport FOUPs F except for the specific FOUP F so that efficiency in transporting FOUPs F can be enhanced. Consequently, a wait time for transportation of FOUPs F is reduced so that throughput of a substrate treatment can be enhanced.

In a case where the FOUP F is not placed on any of the two sending openers 5A and 5B, a case where the FOUP F is not placed on one of the two return openers 5C and 5D, and a case where the FOUP F is not placed on the empty FOUP shelf EB1 (EB2 through EB4), the FOUP transportation mechanism 62 transports the specific FOUP F to one of the two return openers 5C and 5D. Here, examples of the specific FOUP F include the FOUP F2 in FIG. 13B and the FOUP F16 in FIG. 17C. For example, there is a case where a FOUP F is not placed on a predetermined return opener (e.g., the opener 5C) but a FOUP F is placed on another return opener (e.g., the opener 5D). Even in such a case, the FOUP transportation mechanism 62 can leave the specific FOUP F at the placement position (e.g., the opener 5C) of the specific FOUP F2 (F16) from when all the substrates W are taken from the specific FOUP F2 (F16) to when all the treated substrates W are accommodated in the specific FOUP F2 (F16).

In the substrate treating apparatus 1, each of the first substrate transportation mechanism 6A and the second substrate transportation mechanism 6B transports substrates W for FOUPs F placed on, for example, the two openers 5A and 5B placed in the upward/downward direction, not to the two openers 5A and 5C disposed in the lateral direction. Accordingly, even when the number of openers is increased, the hands 21 capable of moving forward and backward is not slidably moved in the lateral direction, and substrates W are transported by lifting and lowering and rotation. Thus, transportation of the substrates W can be simplified. Accordingly, standby time of substrate transportation can be reduced, and a decrease in substrate transportation efficiency can be prevented. As a result, a throughput of substrate treatment can be enhanced.

The first substrate transportation mechanism 6A takes all the substrates from a FOUP F placed on, for example, the opener 5A in the first opener line 9, and then, a substrate W is taken from another FOUP F placed on the opener 5B in the first opener line 9. After having accommodated all the substrates in the FOUP F placed on the opener 5C in the second opener line 10, the second substrate transportation mechanism 6B accommodates a substrate W in another FOUP F placed on the opener 5D in the second opener line 10.

Accordingly, after having taken all the substrates W from the FOUP F, the first substrate transportation mechanism 6A can take substrates W from another FOUP F. The second substrate transportation mechanism 6B can accommodate all the substrates W in a FOUP F and then accommodate substrates W in another FOUP F.

Second Embodiment

Figure 18:
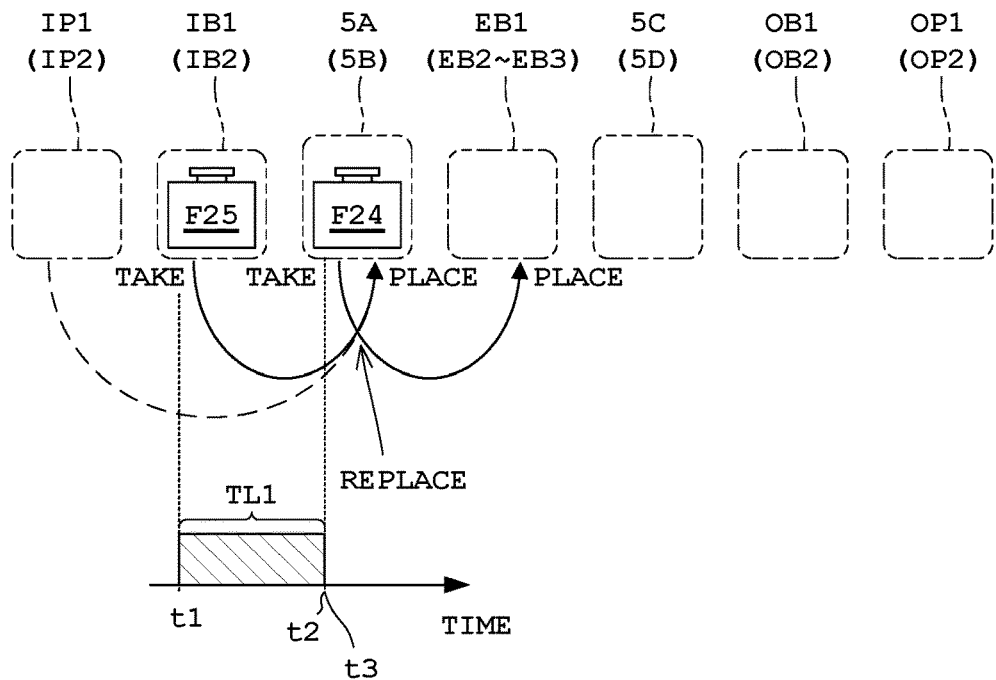
FIG. 18 is an illustration for describing a replacing operation of FOUPs in a substrate treating apparatus according to a second embodiment.

A second embodiment of the present invention will now be described hereinafter with reference to the drawings. Components already described in the first embodiment will be omitted. FIG. 18 is an illustration for describing a replacing operation of FOUPs in a substrate treating apparatus 1 according to a second embodiment.

In the first embodiment, for example, as illustrated in FIGS. 10A to 10D and 15A, the replacing operation of replacing (exchanging) the FOUP F4 placed on the sending opener 5B by the FOUP F6 placed on the untreated substrate FOUP shelf IB2 has been described. As illustrated in FIG. 15D, for example, the replacing operation of replacing the FOUP F1 placed on the return opener 5C by the empty FOUP F3 placed on the empty FOUP shelf EB1 has also been described.

However, with a low efficiency in transporting FOUPs F, the first substrate transportation mechanism 6A (the second substrate transportation mechanism 6B) might wait for FOUPs. In view of this, in the second embodiment, efficiency in transporting FOUPs F is also enhanced.

In FIG. 18, a FOUP F24 placed on a sending opener 5A is replaced by another FOUP F25 placed on an untreated substrate FOUP shelf IB1. Here, if the FOUP transportation mechanism 62 starts transporting the FOUP F25 placed on the untreated substrate FOUP shelf IB1 before a time or around a time when all the substrates W are taken out from the FOUP F24, the FOUP F24 placed on the opener 5A can be smoothly transported.

This will be specifically described. A first substrate transportation mechanism 6A takes all the substrates W from the FOUP F24 placed on one of two sending openers 5A and 5B. Consequently, the first substrate transportation mechanism 6A generates an empty FOUP F24.

Then, the FOUP transportation mechanism 62 performs a replacing operation of replacing a first empty FOUP F24 placed on one of the two openers 5A and 5B by the FOUP F25 placed on the untreated substrate FOUP shelf IB1, by using two grippers 65A and 65B. At this time, the FOUP transportation mechanism 62 starts a transportation operation of the FOUP F25 placed on the untreated substrate FOUP shelf IB1 for a replacing operation before a time expected to be a time t3 when the first empty FOUP F24 is generated by a predetermined time length TL1. In the replacing operation, for example, the upper gripper 65A grasps the FOUP F25, and the lower gripper 65B grasps the FOUP F24.

The time expected to be the time t3 is expected by schedule management software or calculation of a control unit 71, based on information of an optical sensor configured to detect that substrates W are placed on support plates 29B of a substrate buffer unit 7.

The time t3 when the first empty FOUP F24 is generated is, for example, a time or around a time when taking of all the substrates W from a FOUP F is finished. Examples of the time t3 includes a time when a hand 21 of the first substrate transportation mechanism 6A takes the last substrate W from the FOUP F, a time when a shutter 16 closes the empty FOUP F with a lid, and a time when the FOUP F slides to be separated from a wall portion 8 by a sliding mechanism (driven by an electric motor) of a support table 12.

The predetermined time length TL1 (from time t1 to time t2) is set based on an experimental result, for example. The predetermined time length TL1 is a duration of time from start t1 (start time) of a transportation operation of a FOUP F placed on the untreated substrate FOUP shelf IB1 to a time t2 when the FOUP transportation mechanism 62 comes to enable transportation of the first empty FOUP F24.

The start t1 (start time) of the transportation operation of the FOUP F placed on the untreated substrate FOUP shelf IB1 is a time or around a time when at least one of the two grippers 65A and 65B of the FOUP transportation mechanism 62, the two articulated arms 66A and 66B, the elevation driving unit 67, and the horizontal driving unit 68 starts moving from a state where the FOUP transportation mechanism 62 is stationary.

The time t2 at which the FOUP transportation mechanism 62 comes to enable transportation of the first empty FOUP F24 is, for example, a time or around a time when the gripper 65A (65B) is caused to face the FOUP F24 by at least one of an articulated arm 66A (66B) of the FOUP transportation mechanism 62, an elevation driving unit 67, and a horizontal driving unit 68. At this time, the gripper 65A (65B) caused to face the FOUP F24 does not grasp the FOUP F.

In this embodiment, to enhance transportation efficiency of FOUPs F, the FOUP transportation mechanism 62 performs a replacing operation. At this time, for a replacing operation, the FOUP transportation mechanism 62 starts transporting the FOUP F25 placed on the untreated substrate FOUP shelf IB1 before a time expected to be the time t3 when the first empty FOUP F24 is generated by the predetermined time length TL1. Accordingly, at the time t3 when the first empty FOUP F24 is generated, a state where the FOUP transportation mechanism 62 can transport the first empty FOUP F24 (at and around the time t2) can be obtained. Thus, the empty FOUP F24 can be transported in synchronization with the time (time t3) when the empty FOUP F24 is generated so that transportation efficiency of FOUPs F can be further enhanced.

In this description, the FOUP F24 placed on the sending opener 5A (5B) is replaced by the FOUP F25 placed on the untreated substrate FOUP shelf IB1 (IB2). In this regard, as indicated by broken lines in FIG. 18, the FOUP F24 placed on the sending opener 5A (5B) may be replaced by the FOUP F placed on the input port IP1 (1P2). Each of the untreated substrate FOUP shelf IB1 (IB2) and the input port IP1 (1P2) corresponds to an upstream storage shelf of the present invention.

Third Embodiment

Figure 19:
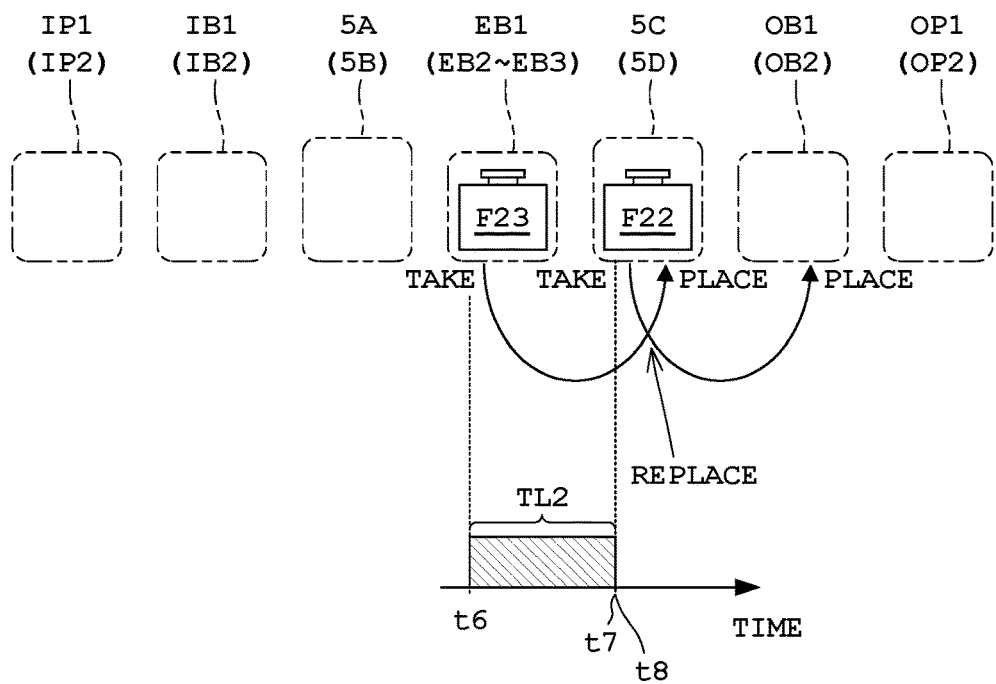
FIG. 19 is an illustration for describing a replacing operation of FOUPs in a substrate treating apparatus according to a third embodiment.

A third embodiment of the present invention will now be described hereinafter with reference to the drawings. Components already described in the first and second embodiments will be omitted. FIG. 19 is an illustration for describing a replacing operation of FOUPs F in a substrate treating apparatus 1 according to the third embodiment.

In the second embodiment, the replacing operation of the empty FOUP F24 placed on the sending opener 5A (5B) has been described. In this embodiment, a replacing operation of a treated substrate FOUP F22 placed on a return opener 5C (5D) will be described.

In FIG. 19, the FOUP F22 placed on the return opener 5C is replaced by another empty FOUP F23 placed on an empty FOUP shelf EB1. Here, if a FOUP transportation mechanism 62 starts transporting the empty FOUP F23 placed on the empty FOUP shelf EB1 before a time when, or before a time around a time when, accommodating of all the substrates W treated in a treating block 3 is finished, the FOUP F22 placed on the return opener 5C can be smoothly transported.

This will now be specifically described. A second substrate transportation mechanism 6B accommodates all the treated substrates W in the second empty FOUP F22 placed on the return opener 5C. Consequently, the second substrate transportation mechanism 6B generates the treated substrate FOUP F22.

Then, the FOUP transportation mechanism 62 performs a replacing operation of replacing the treated substrate FOUP F22 placed on the return opener 5C by a third empty FOUP F23 placed on the empty FOUP shelf EB1 by using two grippers 65A and 65B. At this time, the FOUP transportation mechanism 62 starts transporting the third empty FOUP F23 placed on the empty FOUP shelf EB1 for a replacing operation before a time expected to be a time t8 when the treated substrate FOUP F22 is generated, by a predetermined time length TL2. In the replacing operation, for example, the upper gripper 65A grasps a FOUP F23, and the lower gripper 65B grasps the FOUP F22.

The time t8 when the treated substrate FOUP F22 is generated is, for example, a time or around a time when accommodating of all the treated substrates W in the second empty FOUP F22 is finished. Examples of the time t8 include a time when a hand 21 of the second substrate transportation mechanism 6B accommodates the last substrate W in the FOUP F22, a time when a shutter 16 covers the treated substrate FOUP F22 with a lid, and a time when a sliding mechanism of a support table 12 causes the treated substrate FOUP F22 to slide and move away from the wall portion 8.

The predetermined time length TL2 (from time t6 to time t7) is set based on, for example, an experimental result. The predetermined time length TL2 is a duration of time from start t6 (start time) of an operation of transporting the third empty FOUP 23 placed on the empty FOUP shelf EB1 to a time t7 when the FOUP transportation mechanism 62 comes to enable transportation of the treated substrate FOUP 22.

The start t6 of an operation of transporting the third empty FOUP 23 placed on the empty FOUP shelf EB1 is, for example, a time or around a time when at least one of two grippers 65A and 65B of the FOUP transportation mechanism 62, two articulated arms 66A and 66B, an elevation driving unit 67, and a horizontal driving unit 68 starts moving from a state where the FOUP transportation mechanism 62 is stationary.

The time t7 at which the FOUP transportation mechanism 62 comes to enable transportation of the third empty FOUP F is, for example, a time or around a time when a state where the gripper 65A (65B) is caused to face the treated substrate FOUP F22 by at least one of the articulated arm 66A (66B) of the FOUP transportation mechanism 62, the elevation driving unit 67, and the horizontal driving unit 68. At this time, the gripper 65A (65B) caused to face the untreated FOUP F22 does not grasp the FOUP F.

In this embodiment, to enhance transportation efficiency of FOUPs F, the FOUP transportation mechanism 62 performs a replacing operation. At this time, the FOUP transportation mechanism 62 starts transporting the third empty FOUP F23 placed on the empty FOUP shelf EB1 (EB2 through EB4) for a replacing operation before a time expected to be the time t8 when the treated substrate FOUP F is generated by a predetermined time length TL2. At the time t8 when the treated substrate FOUP F22 is generated, the FOUP transportation mechanism 62 can transport the treated substrate FOUP F22 (time t7 and a time around time t7). Thus, the treated substrate FOUP F22 can be transported in synchronization with the time when the treated substrate FOUP F22 is generated so that transportation efficiency of FOUPs F can be further enhanced.

Fourth Embodiment

Figure 20A:
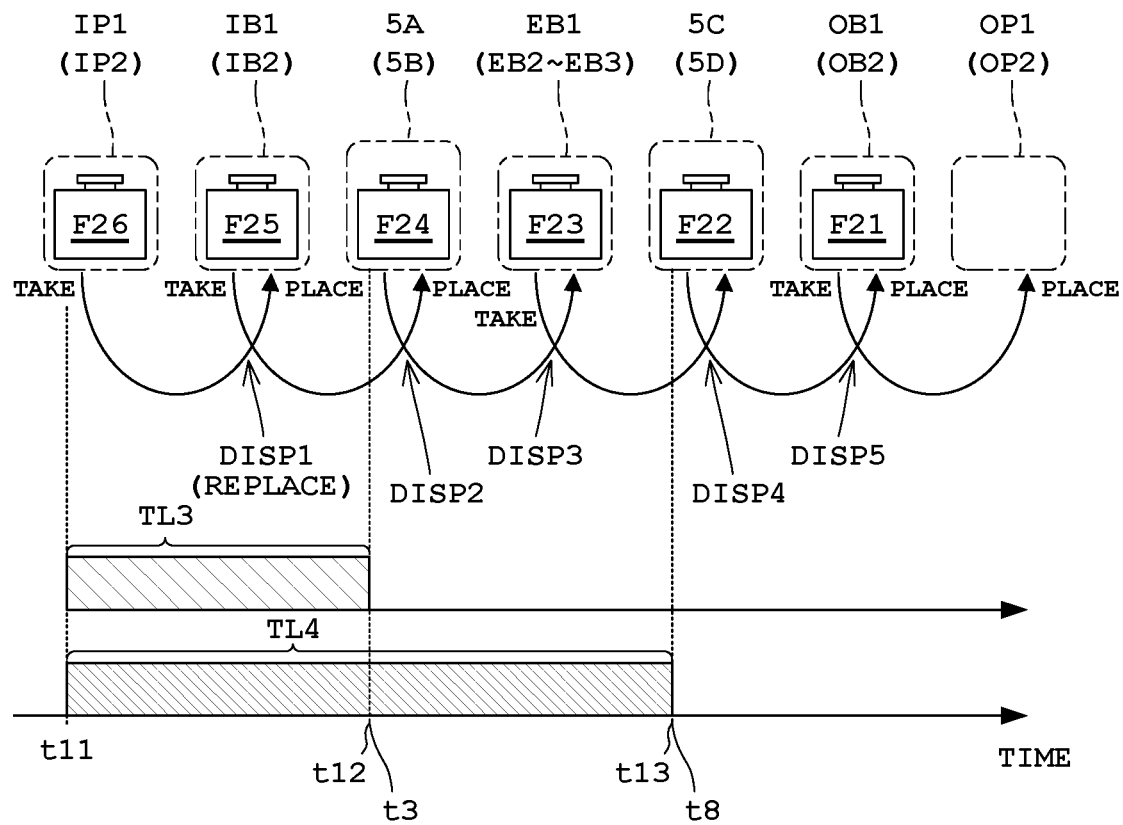
FIG. 20A is an illustration for describing a replacing operation of FOUPs in a substrate treating apparatus according to a fourth embodiment.
Figure 20B:
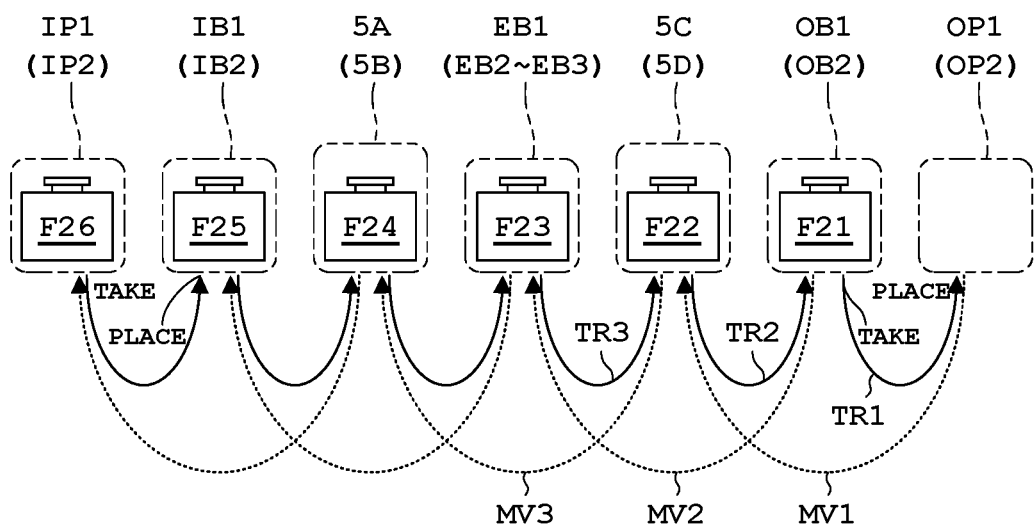
FIG. 20B is an illustration for describing a FOUP transportation operation in the case of not performing a replacing operation by using two grippers.

A fourth embodiment of the present invention will now be described hereinafter with reference to the drawings. Components already described in the first through third embodiments will be omitted. FIG. 20A is an illustration for describing a replacing operation of FOUPs F in a substrate treating apparatus according to the fourth embodiment. FIG. 20B is an illustration for describing a FOUP transportation operation in a case where a replacing operation is not performed by two grippers 65A and 65B.

In the second embodiment, the replacing operation of the empty FOUP F24 placed on the sending opener 5A (5B) has been described. In the third embodiment, the replacing operation of the treated substrate FOUP F22 placed on the return opener 5C (5D) has been described. On the other hand, in this embodiment, a case where a plurality of replacing operations are performed consecutively will be described.

In FIG. 20A, six FOUPs F21 through 26 from an input port IP1 (IP2) to a treated substrate FOUP shelf OB1 (OB2) are moved from an untreated substrate FOUP shelf IB1 (IB2) to an output port OP1 (OP2) by five consecutive replacing operations (DISP1 through DISP5). The FOUPs F21 through 26 are sequentially grasped by a FOUP transportation mechanism 62 from the left in FIG. 20A, and replacing operations are performed in the order of DISP1, DISP2, DISP3, DISP4, and DISP5.

In the replacing operations, for example, the upper gripper 65A grasps the FOUP F26, and the lower gripper 65B grasps the FOUP F25. The upper gripper 65A grasps the FOUP F24, and the lower gripper 65B grasps the FOUP F23. The upper gripper 65A grasps the FOUP F22, and the lower gripper 65B grasps the FOUP F21.

The replacing operation according to this embodiment will be specifically described. A first substrate transportation mechanism 6A takes all the substrates W from the FOUP F24 placed on a sending opener 5A. Consequently, the first substrate transportation mechanism 6A generates a first empty FOUP F24. A second substrate transportation mechanism 6B accommodates all the treated substrates W in the second empty FOUP F22 placed on a return opener 5C. Consequently, the second substrate transportation mechanism 6B generates the treated substrate FOUP F22. Taking of substrates W by the first substrate transportation mechanism 6A is performed in parallel with accommodating of substrates W by the second substrate transportation mechanism 6B.

Then, the FOUP transportation mechanism 62 performs a replacing operation of replacing the first empty FOUP F24 placed on the two opener 5A (5B) by the FOUP F25 placed on the untreated substrate FOUP shelf IB1 (IB2), by using the two grippers 65A and 65B. Thereafter, the FOUP transportation mechanism 62 performs a replacing operation of replacing the third empty FOUP F23 placed on the empty FOUP shelf EB1 (EB2 through EB4) by the first empty FOUP F24 grasped by, for example, the upper gripper 65A, by using the two grippers 65A and 65B. Subsequently, the FOUP transportation mechanism 62 performs a replacing operation of replacing the treated substrate FOUP F22 placed on the return opener 5C (5D) by the third empty FOUP F23 grasped by the lower gripper 65B, by using the two grippers 65A and 65B.

These replacing operations are started based on a later one of the operations. Specifically, in a case where a time expected to be a time t3 when the first empty FOUP F24 is generated is later than a time expected to be a time t8 when the treated substrate FOUP F is generated, the FOUP transportation mechanism 62 starts transporting the FOUP F26 placed on the untreated substrate FOUP shelf IB1 for a replacing operation before a time expected to be the time t3 when the first empty FOUP F is generated by a predetermined time length TL3.

In a case where the time expected to be the time t8 when the treated substrate FOUP F22 is generated is later than the time expected to be the time t3 when the first empty FOUP F24 is generated, the FOUP transportation mechanism 62 starts transporting the FOUP F26 placed on the untreated substrate FOUP shelf IB1 for a replacing operation before the time expected to be the time t8 when the treated substrate FOUP F22 is generated by a predetermined time length TL4.

The time t3 when the first empty FOUP F24 is generated is, for example, a time when, or a time around a time when, taking of all the substrates W from the FOUP F24 is finished (see the second embodiment). The time t8 when the treated substrate FOUP F22 is generated is, for example, a time when, or a time around a time when, accommodating of all the treated substrates W in the second empty FOUP F22 is finished (see the third embodiment).

The predetermined time length TL3 (from time t11 to time t12) and the predetermined time length TL4 (from time t11 to time t13) are set based on, for example, experimental results. The time length TL3 is a duration of time from start t11 (start time) of an operation of transporting the FOUP F26 placed on the input port IP1 to a time t12 when the FOUP transportation mechanism 62 comes to enable transportation of the first empty FOUP F24. The time length TL4 (from time t11 to time t13) is a duration of time from start t11 (start time) of an operation of transporting the FOUP F26 placed on the input port IP1 to a time t13 when the FOUP transportation mechanism 62 comes to enable transportation of the treated substrate FOUP F22.

The start t11 of the operation of transporting the FOUP F26 placed on the input port IP1 are similar to those in the second and third embodiments, and thus, will not described here.

The time t12 when the FOUP transportation mechanism 62 comes to enable transportation of the first empty FOUP F24 is similar to that in the second embodiment, and thus, will not be described here. The time t13 when the FOUP transportation mechanism 62 comes to enable transportation of the treated empty FOUP F22 is similar to that in the third embodiment, and thus, will not be described here.

In this embodiment, the FOUP transportation mechanism 62 performs first through fifth replacing operations in order to enhance transportation efficiency of FOUPs F. In this case, the FOUP transportation mechanism 62 starts transporting the FOUP F26 placed on the input port IP1 (IP2) for a replacing operation before a later one of the time expected to be the time t3 when the first empty FOUP F24 is generated and the time expected to be the time t8 when the treated FOUP F22 is generated by a predetermined time length (time length TL3 or time length TL4). For example, even if transportation of the FOUP F is started based on the time expected to be the time t3 when the first empty FOUP F24 is generated, when the FOUP transportation mechanism 62 comes to enable transportation of the FOUP F22, the second substrate transportation mechanism 6B is occasionally being accommodating substrates W in the second empty FOUP F22. In such a case, a standby time occurs in the FOUP transportation mechanism 62. According to the present invention, a state where the first empty FOUP F24 or the treated substrate FOUP F22 can be transported is obtainable in synchronization with the time t3 when the first empty FOUP F24 is generated or the time t8 when the treated substrate FOUP F22 is generated. Thus, it is possible to further enhance transportation efficiency of FOUPs F while reducing a standby time of FOUP transportation in the case of replacing FOUPs F consecutively.

FIG. 20B is an illustration of a FOUP transportation operation in the case of performing no replacing operation. In FIG. 20B, the FOUP F21 is transported from the treated substrate FOUP OB1 (OB2) to the output port OP1 (OP2) (see TR1). Thereafter, a gripper is moved to the opener 5C (5D) (see MV1). Subsequently, the FOUP F22 is transported from the return opener 5C (5D) to the treated substrate FOUP OB1 (OB2) (see TR2). Then, the gripper is moved to the empty FOUP shelf EB1 (EB2 through EB4) (see MV2). In this manner, in the case of not performing a replacing operation by the two grippers 65A and 65B, FOUPs F need to be transported one by one.

As illustrated in FIG. 20A, as the number of replacing operations increases, FOUP transportation efficiency can be further enhanced. In addition, the FOUP transportation mechanism 62 starts transporting the FOUP 26 before a later one of the time expected to be the time t3 when the first empty FOUP F24 is generated and the time expected to be the time t8 when the treated FOUP F22 is generated, by a predetermined time length. A state where the first empty FOUP F24 or the treated substrate FOUP F22 can be transported can be obtained in synchronization with the time t3 when the first empty FOUP F24 is generated or the time t8 when the time t3 is generated. Thus, transportation efficiency of FOUPs F can be further enhanced.

In this embodiment, five replacing operations are performed. In this regard, as illustrated in FIG. 20A, the number of replacing operations may be four (DISP2 through DISP5). The number of replacing operations may also be three (DISP2 through DISP4). The first empty FOUP F24 of the sending opener 5A (5B) may be replaced by the FOUP 26 of the input port IP1 (IP2).

The present invention is not limited to the embodiment described above, and may be modified as described below.

(1) In the embodiments described above, the first opener line 9 includes the two openers 5A and 5B, and the second opener line 10 includes the two openers 5C and 5D. In this regard, each of the first opener line 9 and the second opener line 10 may include three or more openers. In this case, the shutter 16 may move in the rightward/leftward direction (Y-direction) without moving in the upward/downward direction. Accordingly, even if three or more openers are arranged in the upward/downward direction, the height of the ID block can be reduced.

For example, supposing the first opener line 9 includes three openers 5A, 5B, and 5E. In this case, the first substrate transportation mechanism 6A may take substrates W in units of FOUPs cyclically in the order of the "opener 5A," the "opener 5B," and the "opener 5E."

(2) In the embodiments and the modification (1) described above, the two openers 5A and 5B are used as sending openers, and the two openers 5C and 5D are used as return openers. Alternatively, the functions of these openers may be switched. Specifically, the two openers 5C and 5D may be used as sending openers with the two openers 5A and 5B being used as return openers. In this case, in FIGS. 13A and 13B, the FOUPs F1 and F2 are respectively transported to the return openers 5A and 5B, and substrates W are sequentially taken out therefrom.

(3) In the embodiment and the modifications described above, in FIG. 11, after the determination in step S03, the determination in step S04 is performed. In this regard, the determination in step S03 may be performed after the determination in step S04. In this case, as a result of the determination in step S04, if all the conditions are satisfied (YES), the process proceeds to step S06, whereas if all the conditions are not satisfied (NO), the process proceeds to step S03. As a result of the determination in step S03, if it is determined that substrates can be transported (YES), the process proceeds to step S07, whereas if it is determined that substrates cannot be transported (NO), the process proceeds to step S05. In the case of this variation, an arrow returned from step S08 may be returned to a state before step S04 in order to perform the determination in the order of step S04 and step S03.

Figure 21:
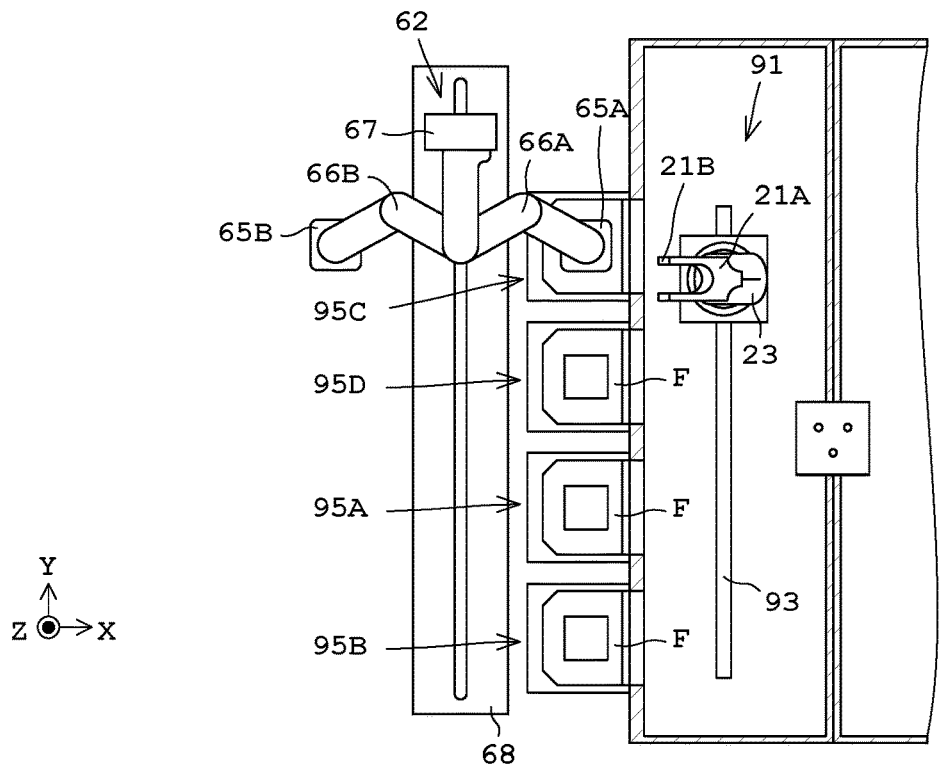
FIG. 21 is a transverse cross-sectional view of a substrate treating apparatus according to a modification.

(4) In the embodiments and the modifications described above, the ID block 2 includes the two substrate transportation mechanisms 6A and 6B. In this regard, the ID block 2 may include a seventh substrate transportation mechanism 91 movable in the Y-direction, instead of the two substrate transportation mechanisms 6A and 6B (see FIG. 21). In this case, the seventh substrate transportation mechanism 91 includes a horizontal movement mechanism 93 that moves the two hands 21A and 21B and the forward/backward driving unit 23, for example, in the Y-direction. The horizontal movement mechanism 93 includes an electric motor. As illustrated in FIG. 21, the four openers 95A through 95D may be arranged in the horizontal direction (Y-direction).

Figure 22:
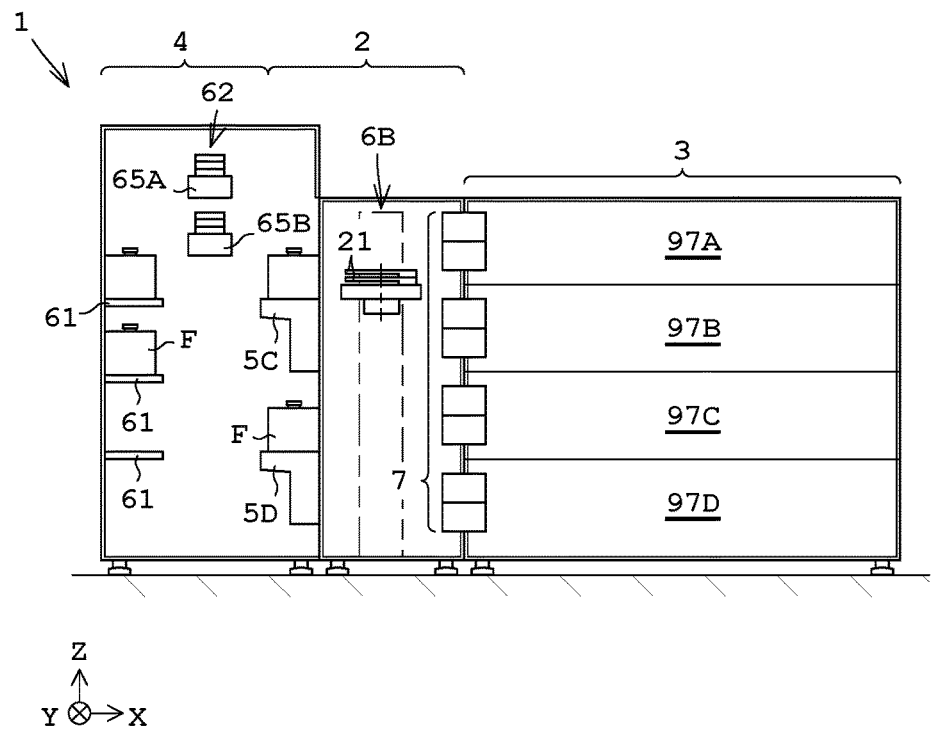
FIG. 22 is a longitudinal cross-sectional view of a substrate treating apparatus according to a modification.

(5) In the embodiments and the modifications described above, the treating block 3 includes the coating block 31 and the development block 32 arranged in the horizontal direction (Y-direction). In this regard, as illustrated in FIG. 22, the treating block 3 may be a single block including four coating-treatment layers 97A through 97D arranged in the upward/downward direction. In this case, for example, each of the four coating-treatment layers 97A through 97D may include a third substrate transportation mechanism, heat-treatment units in 5 lines×3 levels, and coating units SC in 4 lines×1 level.

(6) In the embodiments and the modifications described above, step S04 in FIG. 11 may be replaced by the following operation. If no FOUP F is placed on the four openers 5A to 5D and the empty FOUP shelves EB1 to EB4 (see FIG. 13A), the FOUP transportation mechanism 62 transports FOUPs F to all the two return openers 5C and 5D, and then transports a FOUP F to one of the two sending openers 5A and 5B (see FIGS. 13A to 13C).

The present invention may be embodied in other specific forms without departing from the spirit or essential attributes thereof and, accordingly, reference should be made to the appended claims, rather than to the foregoing specification, as indicating the scope of the invention.

What is claimed is:

1. A method for controlling a substrate treating apparatus, the substrate treating apparatus including
a treating area having a plurality of substrate holders for receiving respective substrates, and at which the substrate treating apparatus performs a plurality of treatments on the respective substrates having been transported from a carrier capable of accommodating a plurality of substrates,
two or more first carrier platforms on each of which the carrier is placed,
two or more second carrier platforms on each of which the carrier is placed,
a substrate buffer unit configured to be used for sending a substrate to the treating area and for returning a substrate from the treating area, a plurality of substrates being allowed to be placed on the substrate buffer unit,
a substrate transportation mechanism having hands for holding a substrate and being movable for transporting the substrate,
an empty carrier shelf on which the carrier which is empty after having taken every substrate from the carrier is placed, and
a carrier transportation mechanism which is movable for transporting the carrier, and including movable grippers each configured to grip the carrier,
the method comprising:
a first setting step of setting a normal substrate sending operation of the substrate transportation mechanism to transport a substrate to the substrate buffer unit from the carrier placed on each of the two or more first carrier platforms;
a second setting step of setting a normal substrate returning operation of the substrate transportation mechanism to transport a substrate from the substrate buffer unit to the carrier placed on each of the two or more second carrier platforms;
a determining step of determining whether or not a case where the carrier is not placed on any of the two or more first carrier platforms, a case where the carrier is placed on at least one of the two or more second carrier platforms, and a case where the carrier is not placed on the empty carrier shelf are all satisfied;
a specific carrier transporting step of causing the carrier transportation mechanism to transport a specific carrier to one of the two or more second carrier platforms if all the cases are satisfied;
a substrate transporting step of causing the substrate transportation mechanism to transport a substrate from the specific carrier to the substrate buffer unit and then to transport a treated substrate, treated in the treating area, from the substrate buffer unit to the specific carrier, which operation is different from the normal substrate returning operation; and
a specific carrier leaving step of causing the carrier transportation mechanism to leave the specific carrier at a placement position of the specific carrier from when every substrate is taken from the specific carrier by the substrate transportation mechanism to when every treated substrate is accommodated in the specific carrier.

2. The method for controlling the substrate treating apparatus according to claim 1, wherein
in the determining step, it is determined whether or not a case where the carrier is not placed on any of the two or more first carrier platforms, a case where the carrier is not placed on one of the two or more second carrier platforms, and a case where the carrier is not placed on the empty carrier shelf are all satisfied.

3. The method for controlling the substrate treating apparatus according to claim 1, wherein
the substrate treating apparatus further includes, in addition to a first substrate transportation mechanism as the substrate transportation mechanism, a second substrate transportation mechanism configured to transport a substrate;

in the first setting step, the normal substrate sending operation of the first substrate transportation mechanism is set to transport a substrate to the substrate buffer unit from the carrier placed on each of the two or more first carrier platforms;

in the second setting step, the normal substrate returning operation of the second substrate transportation mechanism is set to transport a substrate from the substrate buffer unit to the carrier placed on each of the two or more second carrier platforms;

in the substrate transporting step, the second substrate transportation mechanism transports a substrate from the specific carrier to the substrate buffer unit and then transports a treated substrate, treated in the treating area, from the substrate buffer unit to the specific carrier, which operation is different from the normal substrate returning operation; and in the specific carrier leaving step, the carrier transportation mechanism leaves the specific carrier at a placement position of the specific carrier from when the second substrate transport mechanism takes every substrate from the specific carrier to when the second substrate transport mechanism accommodates every treated substrate in the specific carrier.

* * * * *